(12) United States Patent
Kimura

(10) Patent No.: US 11,262,404 B2
(45) Date of Patent: Mar. 1, 2022

(54) SEMICONDUCTOR INTEGRATED CIRCUIT

(71) Applicant: ROHM Co., LTD., Kyoto (JP)

(72) Inventor: Hiromitsu Kimura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 28 days.

(21) Appl. No.: 16/831,509

(22) Filed: Mar. 26, 2020

(65) Prior Publication Data
US 2020/0309855 A1 Oct. 1, 2020

(30) Foreign Application Priority Data

Mar. 29, 2019 (JP) ............................ JP2019-065962

(51) Int. Cl.
*G01R 31/3185* (2006.01)
*G01R 31/3183* (2006.01)

(52) U.S. Cl.
CPC ........... *G01R 31/318552* (2013.01); *G01R 31/318371* (2013.01); *G01R 31/318536* (2013.01); *G01R 31/318541* (2013.01)

(58) Field of Classification Search
CPC .... G01R 31/318552; G01R 31/318371; G01R 31/318541; G01R 31/318536
USPC ............... 714/731, 726, 727, 728, 729, 738
See application file for complete search history.

(56) References Cited

U.S. PATENT DOCUMENTS

| | | | |
|---|---|---|---|
| 6,539,511 B1* | 3/2003 | Hashizume | G01R 31/3004 714/726 |
| 6,938,225 B2* | 8/2005 | Kundu | G01R 31/318541 714/727 |
| 8,271,226 B2* | 9/2012 | Chakravadhanula | G01R 31/318575 702/119 |
| 2004/0041610 A1* | 3/2004 | Kundu | G01R 31/318541 327/215 |
| 2004/0124881 A1* | 7/2004 | Thadikaran | G06F 11/2236 326/93 |
| 2004/0250185 A1* | 12/2004 | Date | G01R 31/318572 714/726 |
| 2011/0161756 A1* | 6/2011 | Inagawa | G01R 31/318533 714/726 |
| 2013/0031436 A1* | 1/2013 | Mizutani | G01R 31/318555 714/729 |
| 2016/0169966 A1* | 6/2016 | Abshishek | G01R 31/318541 714/727 |

FOREIGN PATENT DOCUMENTS

JP 2016-109523 A 6/2016

OTHER PUBLICATIONS

Hsieh et al., DR-Scan: Dual-Rail Asynchronous Scan DfT and ATPG, Jan. 2019, IEEE, vol. 38, No. 1, pp. 136-148. (Year: 2019).*

(Continued)

*Primary Examiner* — John J Tabone, Jr.
(74) *Attorney, Agent, or Firm* — Chip Law Group

(57) ABSTRACT

Disclosed is a semiconductor integrated circuit including a logic circuit, and a plurality of scan flip-flop circuits that hold input data or output data of the logic circuit and are capable of forming a scan chain for executing a scan test of the logic circuit. Each scan flip-flop circuit includes a scan data input part that receives input of scan data for the scan test, a normal data input part that receives input of normal data different from the scan data, and a data holding part capable of separately holding the normal data and the scan data.

10 Claims, 9 Drawing Sheets

(56) References Cited

OTHER PUBLICATIONS

Majumdar et al., Handling Clock-Domain Crossings in Dual Clock-Edge Logic for DFx Features, 2018, IEEE, pp. 36-41. (Year: 2018).*

* cited by examiner

THROUGH-STATE OF MASTER LATCH CIRCUIT

HOLD-STATE OF MASTER LATCH CIRCUIT

THROUGH-STATE OF SLAVE LATCH CIRCUIT

HOLD-STATE OF SLAVE LATCH CIRCUIT

SEMICONDUCTOR INTEGRATED CIRCUIT

CROSS REFERENCE TO RELATED APPLICATIONS

This US. Application claims priority benefit of Japanese Patent Application No. 2019-065962 filed in the Japan Patent Office on Mar. 29, 2019. Each of the above-referenced applications is hereby incorporated herein by reference in its entirety.

BACKGROUND

The present disclosure relates to a semiconductor integrated circuit.

The scan test is known as a fault diagnosis technique (fault check technique) of a semiconductor integrated circuit using a technique of design for testability. In FIG. 13, a configuration of a data processing device 901 as a semiconductor integrated circuit configured to allow the scan test is depicted. In the data processing device 901, a scan flip-flop circuit group 911 that holds input data to a logic circuit 912 and a scan flip-flop circuit group 913 that holds input data from the logic circuit 912 are disposed. Each of the circuit groups 911 and 913 is composed of plural scan flip-flop circuits (hereinafter, referred to as SFF). Each SFF configuring the circuit groups 911 and 913 executes latch operation of data in synchronization with a clock signal CLK'.

A test pattern generating circuit 920 forms a scan chain in which plural SFFs are serially connected by supplying a signal for each SFF in a scan test, and supplies test pattern data to the scan chain. The test pattern data is data beneficial for diagnosis of whether or not a fault in the logic circuit 912 exists. The data configuring the test pattern data is sent to the first stage of the scan chain as scan data.

In the scan test, by causing the scan chain composed of the circuit group 911 to execute shift operation, this scan chain is caused to hold the test pattern data. Thereafter, capture operation of causing the circuit group 913 to take in output data of the logic circuit 912 when the test pattern data is input to the logic circuit 912 is executed. Subsequently, by causing the scan chain composed of the circuit group 913 to execute shift operation, output data of the logic circuit 912 by the scan test, i.e., output data of the logic circuit 912 based on the test pattern data, is sent to a test result evaluation circuit 930. The test result evaluation circuit 930 determines whether or not a fault in the logic circuit 912 exists by comparing the data supplied from the scan chain with expected data.

Normal operation is executed in a section in which the scan test is not executed. In the normal operation, each SFF functions as a normal D flip-flop circuit and executes operation of taking in and holding normal data supplied to a data input terminal of each SFF. As depicted in FIG. 14, each SFF is composed of an input selection circuit 951 that selects normal data or scan data and a D flip-flop circuit 952 that takes in and holds selected data by the input selection circuit 951 in synchronization with a clock signal CLK'.

An example of the related art is disclosed in Japanese Patent Laid-Open No. 2016-109523.

SUMMARY

In the data processing device 901 in FIG. 13, once operation of a scan test is started, it is not until a series of operation due to the scan test is completed that the normal operation can be executed. For this reason, the scan test may not be applied to an application in which it is difficult to stop the normal operation for the time for fault diagnosis (for example, application of a communication control system).

Furthermore, due to execution of operation of the scan test, latch data held thus far in the circuit is discarded. Therefore, after completion of operation of the scan test, the normal operation needs to be started from the initial state. That is, the normal operation is reset every time operation of a scan test is executed. This means that the scan test can be executed only at the timing when the reset of the normal operation is permitted, and the configuration of FIG. 13 is unsuitable as a measure for periodically executing fault diagnosis.

It is desirable to provide a semiconductor integrated circuit that contributes to suppression of inconvenience or harmful effects relating to execution of a scan test.

A semiconductor integrated circuit according to an embodiment of the present disclosure is a semiconductor integrated circuit including a logic circuit and a plurality of scan flip-flop circuits that hold input data or output data of the logic circuit and are capable of forming a scan chain for executing a scan test of the logic circuit. The semiconductor integrated circuit has a configuration (first configuration) in which each scan flip-flop circuit includes a scan data input part that receives input of scan data for the scan test, a normal data input part that receives input of normal data different from the scan data, and a data holding part capable of separately holding the normal data and the scan data.

The semiconductor integrated circuit according to the above-described first configuration may have the following configuration (second configuration). A test pattern generating circuit that generates a test pattern data supplied to the scan chain in the scan test and supplies an input selection signal and an output selection signal to each scan flip-flop circuit is further disposed. Each scan flip-flop circuit includes an input selection circuit that selects and outputs the normal data or the scan data based on the input selection signal, a first holding circuit that takes in and holds data from the input selection circuit based on a first clock signal, a second holding circuit that takes in and holds the data from the input selection circuit based on a second clock signal, and an output selection circuit that selects and outputs held data of the first holding circuit or held data of the second holding circuit based on the output selection signal.

The semiconductor integrated circuit according to the above-described second configuration may have the following configuration (third configuration). In each scan flip-flop circuit, the scan chain is formed through selection of the scan data in the input selection circuit based on the input selection signal and selection of held data of the holding circuit for holding the scan data in the first holding circuit and the second holding circuit in the output selection circuit based on the output selection signal.

The semiconductor integrated circuit according to the above-described second or third configuration may have the following configuration (fourth configuration). The plurality of scan flip-flop circuits are composed of a first scan flip-flop group that holds input data to the logic circuit and a second scan flip-flop group that holds output data from the logic circuit. A data input circuit that supplies the normal data to each scan flip-flop circuit configuring the first scan flip-flop group is further disposed. Normal operation based on the normal data from the data input circuit is executed by supply of the normal data from the data input circuit to the logic circuit through the first scan flip-flop group. In each scan flip-flop circuit, the normal data in the normal operation is held in either one holding circuit in the first holding circuit and the second holding circuit and the scan data is held in another holding circuit.

The semiconductor integrated circuit according to the above-described fourth configuration may have the following configuration (fifth configuration). In a process of sequential execution of N times of normal operation at intervals, operation in the scan test is executed in a distributed manner by using (N−1) intervals that exist between an execution section of a first round of normal operation and an execution section of an N-th round of normal operation (N is an integer equal to or larger than 3).

The semiconductor integrated circuit according to any one of the above-described second to fifth configuration may have the following configuration (sixth configuration). The semiconductor integrated circuit further includes a clock signal generating circuit that generates the first and second clock signals based on a reference clock signal whose signal level cyclically changes between first and second levels. The clock signal generating circuit sets a first section in which a signal level of the first clock signal changes between the first and second levels and a second section in which a signal level of the second clock signal changes between the first and second levels in such a manner that the first section and the second section are separated from each other.

The semiconductor integrated circuit according to the above-described sixth configuration may have the following configuration (seventh configuration). In each scan flip-flop circuit, the first holding circuit takes in and holds the data from the input selection circuit according to predetermined level change of the first clock signal in the first section, and the second holding circuit takes in and holds the data from the input selection circuit according to predetermined level change of the second clock signal in the second section.

The semiconductor integrated circuit according to the above-described sixth or seventh configuration may have the following configuration (eighth configuration). A test control circuit that generates a test control signal for controlling execution timing of the scan test is further disposed. The test pattern generating circuit supplies the test pattern data to the scan chain and supplies the input selection signal and the output selection signal to each scan flip-flop circuit based on the test control signal. The clock signal generating circuit generates the first and second clock signals from the reference clock signal based on the test control signal.

The semiconductor integrated circuit according to the above-described fourth or fifth configuration may have the following configuration (ninth configuration). In each scan flip-flop circuit, while the first holding circuit takes in and holds the normal data from the input selection circuit in the normal operation based on the first clock signal, the second holding circuit takes in and holds the scan data from the input selection circuit based on the second clock signal when the scan chain is formed.

The semiconductor integrated circuit according to the above-described fourth or fifth configuration may have the following configuration (tenth configuration). A switching control unit that executes switching between a first state and a second state is further disposed. In the first state, in each scan flip-flop circuit, the first holding circuit takes in and holds the normal data from the input selection circuit in the normal operation based on the first clock signal, and the second holding circuit takes in and holds the scan data from the input selection circuit based on the second clock signal when the scan chain is formed. In the second state, in each scan flip-flop circuit, the first holding circuit takes in and holds the scan data from the input selection circuit based on the first clock signal when the scan chain is formed, and the second holding circuit takes in and holds the normal data from the input selection circuit in the normal operation based on the second clock signal.

According to the present disclosure, it becomes possible to provide a semiconductor integrated circuit that contributes to suppression of inconvenience or harmful effects relating to execution of a scan test.

DETAILED DESCRIPTION OF THE PREFERRED EMBODIMENTS

Examples of embodiments of the present disclosure will be specifically described below with reference to the drawings. The same part is given the same numeral in each referenced diagram, and overlapping description relating to the same part is omitted in principle. In the present specification, in terms of simplification of description, by describing a symbol or numeral to refer to information, signal, physical quantity, element, part, or the like, the name of the information, signal, physical quantity, element, part, or the like corresponding to this symbol or numeral is omitted or abbreviated in some cases. For example, an output selection signal referenced by "SEL" to be described later (see FIG. 3) is represented as the output selection signal SEL in some cases and is possibly abbreviated as the signal SEL. However, they all refer to the same thing.

First, explanation will be made regarding several terms used in the description of embodiments of the present disclosure. In the embodiments of the present disclosure, IC is an abbreviation for integrated circuit. The level refers to the level of the potential and the high level has a higher potential than the low level regarding a freely-selected signal or voltage. Regarding a certain arbitrary signal to which attention is paid, when the signal to which attention is paid is at the high level, the inversion signal of this signal to which attention is paid takes the low level. When the signal to which attention is paid is at the low level, the inversion signal of this signal to which attention is paid takes the high level. In a freely-selected signal or voltage, switching from the low level to the high level is referred to as up-edge and switching from the high level to the low level is referred to as down-edge.

First Embodiment

Figure 1:
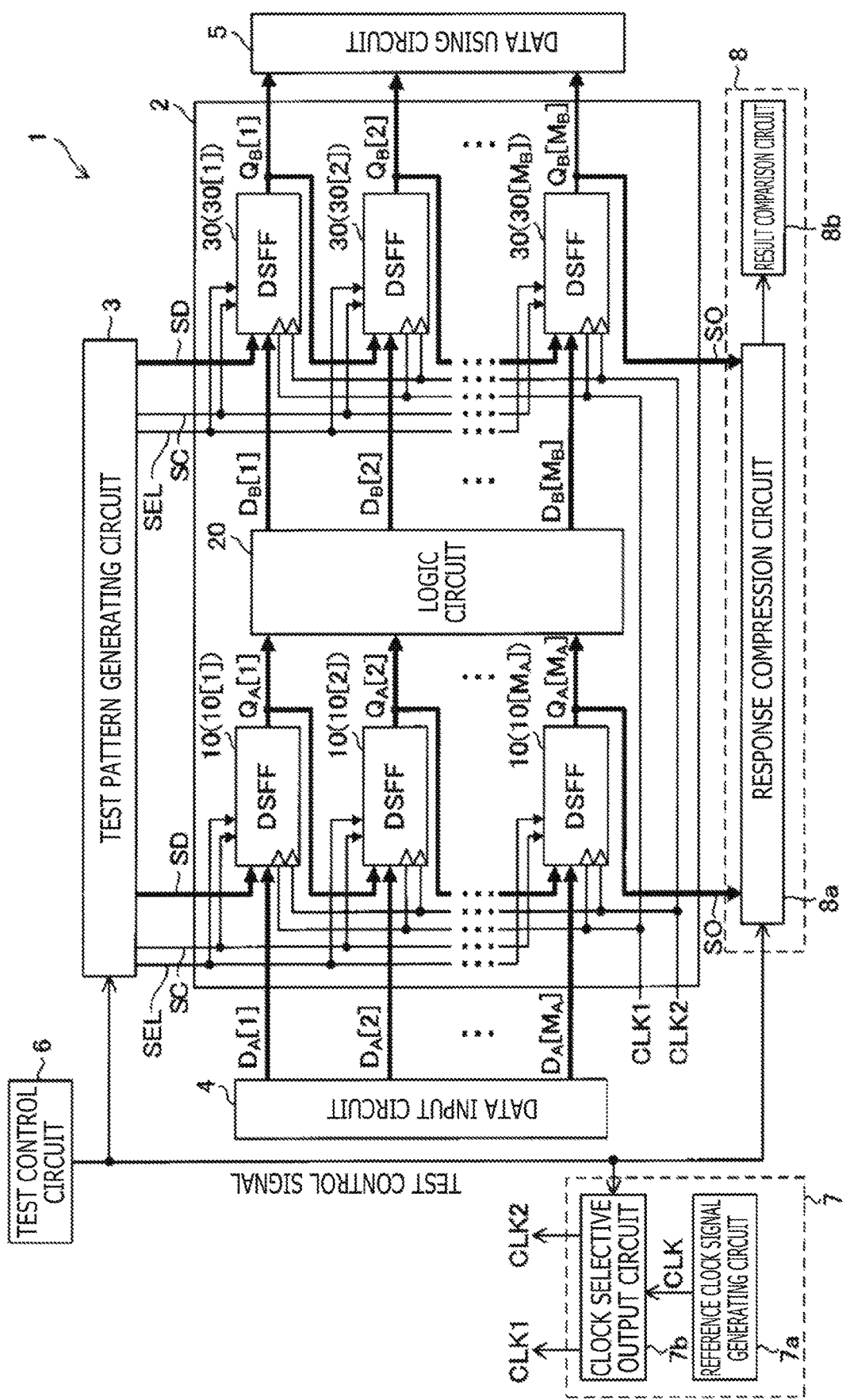
FIG. 1 is a configuration diagram of a data processing device according to a first embodiment of the present disclosure.

A first embodiment of the present disclosure will be described. FIG. 1 is a configuration diagram of a data processing device 1 according to the first embodiment of the present disclosure. The data processing device 1 is configured as a semiconductor integrated circuit. The data processing device 1 includes a digital processing circuit 2, a test pattern generating circuit 3, a data input circuit 4, a data using circuit 5, a test control circuit 6, and a clock signal generating circuit 7 and a test result evaluation circuit 8. Here, attention is paid to only the major part relating to the present disclosure in the constituent elements of the data processing device 1 and other constituent elements different from the constituent elements referenced by numerals 2 to 8 are also possibly included in the data processing device 1. However, diagrammatic representation and explanation of the other constituent elements are omitted.

The clock signal generating circuit 7 includes a reference clock signal generating circuit 7a that generates and outputs a reference clock signal CLK and a clock selective output circuit 7b that generates and outputs clock signals CLK1 and CLK2 from the reference clock signal CLK based on a test control signal from the test control circuit 6.

Figure 2A:
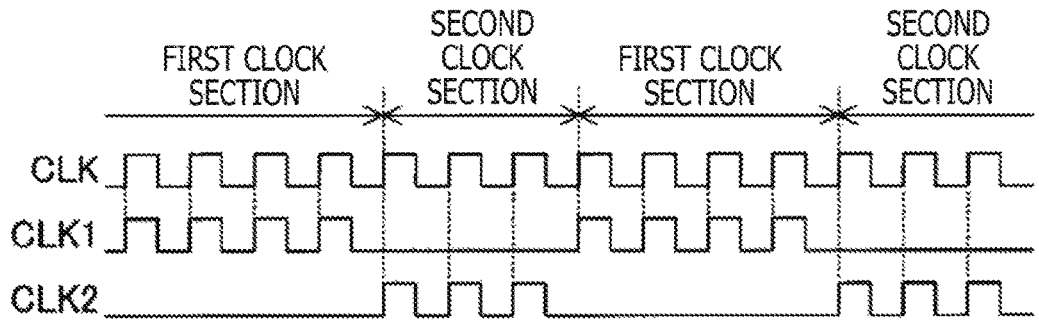
FIGS. 2A and 2B are diagrams depicting a relationship among three clock signals according to the first embodiment of the present disclosure.

In FIG. 2A, a relationship example between the reference clock signal CLK and the clock signals CLK1 and CLK2 is depicted. The reference clock signal CLK is a rectangular signal having a predetermined frequency (for example, 2 MHz) and therefore the signal level of the reference clock signal CLK is cyclically switched between the low level and the high level. First clock sections and second clock sections are set in the clock selective output circuit 7b based on the test control signal. The first clock section and the second clock signal are sections that do not overlap with each other. That is, the first clock section and the second clock section are set separately from each other.

In the first clock section, the clock signal CLK1 has the same signal level as the reference clock signal CLK and the signal level of the clock signal CLK2 is fixed at the low level. Specifically, in the first clock section, the clock signal CLK1 changes between the low level and the high level in synchronization with the reference clock signal CLK whereas the signal level of the clock signal CLK2 is fixed at the low level. Meanwhile, in the second clock section, the clock signal CLK2 has the same signal level as the reference clock signal CLK and the signal level of the clock signal CLK1 is fixed at the low level. Specifically, in the second clock section, the clock signal CLK2 changes between the low level and the high level in synchronization with the reference clock signal CLK whereas the signal level of the clock signal CLK1 is fixed at the low level.

Figure 2B:
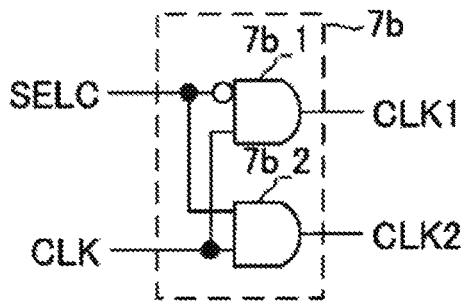

In FIG. 2B, a configuration example of the clock selective output circuit 7b is depicted. In FIG. 2B, a signal SELC represents a clock selection signal included in the test control signal. The clock selection signal SELC is a 1-bit digital signal and takes a signal level of the low level or high level. The clock selective output circuit 7b of FIG. 2B includes an AND circuit 7b_1 that outputs a logical product signal of the inversion signal of the clock selection signal SELC and the reference clock signal CLK as the clock signal CLK1 and an AND circuit 7b_2 that outputs a logical product signal of the clock selection signal SELC and the reference clock signal CLK as the clock signal CLK2. Therefore, the timing at which the clock selection signal SELC is at the low level belongs to the first clock section and the timing at which the clock selection signal SELC is at the high level belongs to the second clock section.

The clock signals CLK1 and CLK2 are supplied to the digital processing circuit 2. Although not depicted in the diagram particularly, the reference clock signal CLK is given to the test pattern generating circuit 3 and the test result evaluation circuit 8 and the circuits 3 and 8 operate in synchronization with the reference clock signal CLK. The data input circuit 4, the data using circuit 5, and the test control circuit 6 may operate in synchronization with the reference clock signal CLK or may operate in synchronization with a clock signal different from the reference clock signal CLK.

The data input circuit 4 supplies pieces of data DA[1] to DA[MA] to the digital processing circuit 2. Here, MA is a freely-selected integer equal to or larger than 2. The pieces of data DA[1] to DA[MA] are simultaneously input to the digital processing circuit 2 through MA interconnects disposed between the data input circuit 4 and the digital processing circuit 2.

The digital processing circuit 2 includes plural flip-flop circuits. Each flip-flop circuit disposed in the digital processing circuit 2 is a scan flip-flop circuit that can configure a scan chain. Hereinafter, each flip-flop circuit disposed in the digital processing circuit 2 will be referred to as DSFF. The "DSFF" is an abbreviation for "Dual Scan Flip-Flop." The reason why each flip-flop circuit disposed in the digital processing circuit 2 is referred to as DSFF will become clear from explanation to be made later.

Specifically, the digital processing circuit 2 includes a logic circuit 20, MA DSFFs 10 in total disposed on the previous stage side of the logic circuit 20, and MB DSFFs 30 in total disposed on the subsequent stage side of the logic circuit 20. MB is a freely-selected integer equal to or larger than 2. MA and MB may have values identical to each other or may have values different from each other. When the MA DSFFs 10 need to be discriminated from each other, the MA DSFFs 10 are referenced by numerals "10[1] to 10[MA]." When the MB DSFFs 30 need to be discriminated from each other, the MB DSFFs 30 are referenced by numerals "30[1] to 30[MB]." The DSFFs 10[1] to 10[MA] and the DSFFs 30[1] to 30[MB] have configurations identical to each other.

Under control by the test control circuit 6, specifically based on the test control signal supplied from the test control circuit 6, the test pattern generating circuit 3 supplies data SD to the DSFFs 10[1] and 30[1] and outputs an input selection signal SC and the output selection signal SEL to each of the DSFFs 10[1] to 10[MA] and 30[1] to 30[MB].

Figure 3:
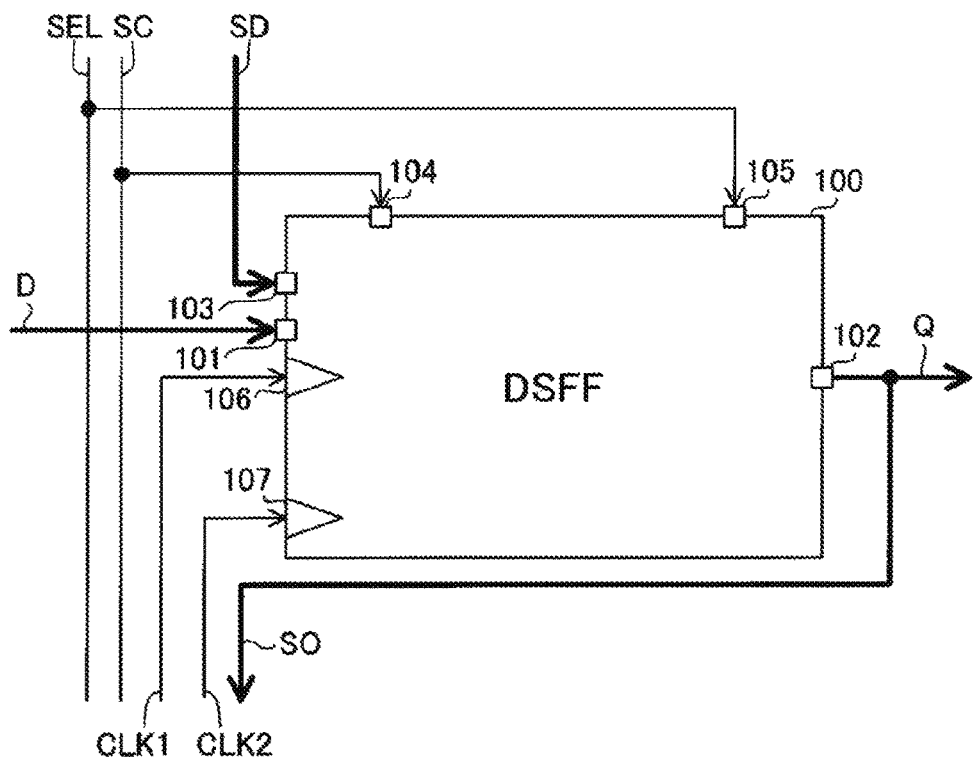
FIG. 3 is a configuration diagram that relates to input and output of data and signals regarding a scan flip-flop circuit according to the first embodiment of the present disclosure.

In FIG. 3, the configuration relating to input and output of data and signals in one DSFF 100 is depicted. The DSFF 100 can be used as each of the DSFFs 10[1] to 10[MA] and the DSFFs 30[1] to 30[MB].

The DSFF 100 includes two input parts 101 and 103 as input terminals of two kinds of data. The data input to the input part 101 is referred to as normal data and the normal data is referenced with symbol "D." Thus, the input part 101 can be referred to as the normal data input part. The data input to the input part 103 is data for implementing a scan test and is referred to as scan data (or scan input data). The scan data is referenced with symbol "SD." The input part 103 can be referred to as the scan data input part.

The DSFF 100 further includes a data output part 102 at which output data Q of the DSFF 100 appears, an input selection signal input part 104 that receives input of the input selection signal SC that should be referred to also as the data input switching signal, an output selection signal input part 105 that receives input of the output selection signal SEL, a first clock input part 106 that receives input of the clock signal CLK1, and a second clock input part 107 that receives input of the clock signal CLK2.

In the data processing device 1 of FIG. 1, the pieces of normal data D for the DSFFs 10[1] to 10[MA] are pieces of data DA[1] to DA[MA], respectively, and the pieces of output data Q for the DSFFs 10[1] to 10[MA] are pieces of data QA[1] to QA[MA], respectively. In the data processing device 1 of FIG. 1, the pieces of normal data D for the DSFFs 30[1] to 30[MB] are pieces of data DB[1] to DB[MB], respectively, and the pieces of output data Q for the DSFFs 30[1] to 30[MB] are pieces of data QB[1] to QB[MB], respectively. Each of the pieces of data DA[1] to DA[MA], QA[1] to QA[MA], DB[1] to DB[MB], and QB[1] to QB[MB] is 1-bit digital data.

The pieces of output data QA[1] to QA[MA] of the DSFFs 10[1] to 10[MA] are input to the logic circuit 20. The logic circuit 20 includes a combinational circuit and executes predetermined signal processing (logical operation) based on the pieces of output data QA[1] to QA[MA] to output the result of the signal processing as the pieces of data DB[1] to DB[MB]. The pieces of data DB[1] to DB[MB] from the logic circuit 20 are input to the DSFFs 30[1] to 30[MB], respectively.

The pieces of output data QB[1] to QB[MB] of the DSFFs 30[1] to 30[MB] are supplied to the data using circuit 5. The data using circuit 5 executes predetermined processing based on the data supplied to itself. Another kind of signal processing may be further executed for the pieces of output data QB[1] to QB[MB] of the DSFFs 30[1] to 30[MB] in the digital processing circuit 2 and data obtained by this may be supplied to the data using circuit 5.

The test pattern generating circuit 3 in FIG. 1 is connected to the scan data input parts 103 of the DSFFs 10[1] and 30[1] and can supply the scan data SD to each of the scan data input parts 103 of the DSFFs 10[1] and 30[1].

In each DSFF, the output data Q from the data output part 102 functions also as scan output data SO (see FIG. 3).

Regarding a freely-selected integer i that satisfies "1≤i≤MA−1," the data output part 102 of the DSFF 10[i] is connected to the scan data input part 103 of the DSFF 10[i+1] and therefore the scan output data SO from the DSFF 10[i] becomes the scan data SD to the DSFF 10[i+1]. The scan output data SO from the DSFF 10[MA] is given to the test result evaluation circuit 8.

Regarding a freely-selected integer i that satisfies "1≤i≤MB−1," the data output part 102 of the DSFF 30[i] is connected to the scan data input part 103 of the DSFF 30[i+1] and therefore the scan output data SO from the DSFF 30[i] becomes the scan data SD to the DSFF 30[i+1]. The scan output data SO from the DSFF 30[MB] is given to the test result evaluation circuit 8.

The scan test is implemented by test operation. In the data processing device 1, normal operation and test operation can be executed in a time-sharing manner.

When the test operation is executed, at the necessary timing, the DSFFs 10[1] to 10[MA] are serially connected and thereby a first scan chain that functions as a first shift register is formed by the DSFFs 10[1] to 10[MA]. Furthermore, the DSFFs 30[1] to 30[MB] are serially connected and thereby a second scan chain that functions as a second shift register is formed by the DSFFs 30[1] to 30[MB]. The scan test is executed by using the first and second scan chains.

The normal operation includes operation of generating the pieces of output data QA[1] to QA[MA] based on the pieces of data DA[1] to DA[MA] from the data input circuit 4 and operation of generating the pieces of output data QB[1] to QB[MB] based on the pieces of data DB[1] to DB[MB] output from the logic circuit 20 due to the operation. In the normal operation, the above-described first and second scan chains are not formed and each of the DSFFs 10[1] to 10[MA] and 30[1] to 30[MB] functions as an independent flip-flop circuit.

The DSFFs 10[1] to 10[MA] configure a first scan flip-flop group that holds input data to the logic circuit 20 and the DSFFs 30[1] to 30[MB] configure a second scan flip-flop group that holds output data of the logic circuit 20. Each DSFF is configured to be capable of separately holding the data that should be held in the normal operation and the data that should be held in the test operation.

Figure 4:
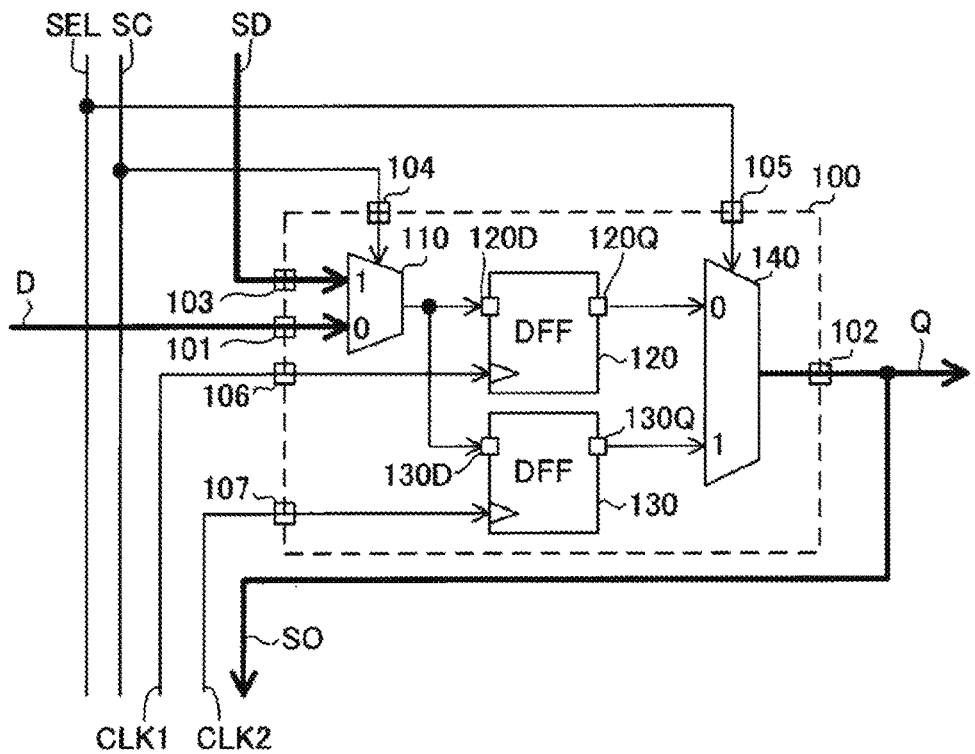
FIG. 4 is a diagram depicting an internal configuration of the scan flip-flop circuit according to the first embodiment of the present disclosure.

In FIG. 4, an internal block diagram of the DSFF 100 is depicted. The DSFF 100 includes an input selection circuit 110, D flip-flop circuits 120 and 130, and an output selection circuit 140. The D flip-flop circuit will be represented as DFF hereinafter. Here, suppose that each of the DFFs 120 and 130 is a positive-edge-triggered DFF. The DFFs 120 and 130 are examples of first and second holding circuits. At the DFFs 120 and 130, a data holding unit that can separately hold the normal data D and the scan data SD is formed.

The input selection circuit 110 has a first input terminal connected to the normal data input part 101, a second input terminal connected to the scan data input part 103, and an output terminal, and selects either one of the first and second input terminals and connects it to the output terminal based on the input selection signal SC. As described above, the normal data D is input to the input part 101 and the scan data SD is input to the input part 103. Therefore, the input selection circuit 110 selects either one of the normal data D and the scan data SD based on the input selection signal SC and outputs the selected data from its own output terminal (in other words, selects either one of the input parts 101 and 103 based on the input selection signal SC and outputs the data at the selected input part from its own output terminal).

The input selection signal SC is a 1-bit digital signal and takes a signal level of the low level or high level. Here, suppose that the input selection signal SC has a value of "1" and the scan data SD is selected in the input selection circuit 110 when the signal level of the input selection signal SC is the high level whereas the input selection signal SC has a value of "0" and the normal data D is selected in the input selection circuit 110 when the signal level of the input selection signal SC is the low level.

The output terminal of the input selection circuit 110 is connected to a data input terminal 120D of the DFF 120 and a data input terminal 130D of the DFF 130 in common.

Therefore, the selected data by the input selection circuit 110 is input to the data input terminal 120D of the DFF 120 and the data input terminal 130D of the DFF 130 in common.

The DFF 120 takes in and holds the data at the data input terminal 120D (i.e., output data of the input selection circuit 110) in synchronization with the up-edge of the clock signal CLK1. The data held in the DFF 120 is output from a data output terminal 120Q of the DFF 120. The DFF 120 can continue to hold the data currently held by itself without changing the data unless the up-edge of the clock signal CLK1 occurs.

The DFF 130 takes in and holds the data at the data input terminal 130D (i.e., output data of the input selection circuit 110) in synchronization with the up-edge of the clock signal CLK2. The data held in the DFF 130 is output from a data output terminal 130Q of the DFF 130. The DFF 130 can continue to hold the data currently held by itself without changing the data unless the up-edge of the clock signal CLK2 occurs.

The output selection circuit 140 has a first input terminal connected to the data output terminal 120Q, a second input terminal connected to the data output terminal 130Q, and an output terminal, and selects either one of the first and second input terminals and connects it to the output terminal based on the output selection signal SEL. Therefore, the output selection circuit 140 selects either one of the output data of the DFF 120 (i.e., held data of the DFF 120) and the output data of the DFF 130 (i.e., held data of the DFF 130) based on the output selection signal SEL and outputs the selected data from its own output terminal. The output terminal of the output selection circuit 140 is connected to the data output part 102 or is equivalent to the data output part 102.

The output selection signal SEL is a 1-bit digital signal and takes a signal level of the low level or high level. Here, suppose that the output selection signal SEL has a value of "1" and the output data of the DFF 130 (i.e., held data of the DFF 130) is selected in the output selection circuit 140 when the signal level of the output selection signal SEL is the high level whereas the output selection signal SEL has a value of "0" and the output data of the DFF 120 (i.e., held data of the DFF 120) is selected in the output selection circuit 140 when the signal level of the output selection signal SEL is the low level.

Next, the behavior of each circuit when only the normal operation is continuously executed will be described. The section in which only the normal operation is continuously executed is referred to as the normal continuation section for convenience. In the normal continuation section, the second clock section does not exist and the whole section becomes the first clock section (see FIG. 2A). That is, in the normal continuation section, the clock signal CLK1 becomes completely the same signal as the reference clock signal CLK whereas the clock signal CLK2 is steadily at the low level. Therefore, in the normal continuation section, the held data of the DFF 120 is sequentially updated in synchronization with the clock signal CLK1 and change does not occur in the held data by the DFF 130.

Furthermore, in the normal continuation section, the values of the input selection signal SC and the output selection signal SEL are both fixed at "0." Thus, in the normal continuation section, operation in which the normal data D is taken in and held by the DFF 120 and the held data of the DFF 120 is output as the output data Q is repeatedly executed in synchronization with the clock signal CLK1.

When attention is paid to the DSFF 10[i], in the normal continuation section, operation in which the data DA[i] is taken in and held as the normal data D in the DFF 120 of the DSFF 10[i] and the held data of the DFF 120 (DA[i]) in the DSFF 10[i] is output as the output data QA[i] of the DSFF 10[i] is repeatedly executed in synchronization with the clock signal CLK1. Similarly, when attention is paid to the DSFF 30[i], in the normal continuation section, operation in which the data DB[i] is taken in and held as the normal data D in the DFF 120 of the DSFF 30[i] and the held data of the DFF 120 (DB[i]) in the DSFF 30[i] is output as the output data QB[i] of the DSFF 30[i] is repeatedly executed in synchronization with the clock signal CLK1.

i is a freely-selected integer.

As above, the normal data D in the normal operation is held in the DFF 120 in each of the DSFFs 10[1] to 10[MA] and 30[1] to 30[MB]. The normal data D in the normal operation held in the DFF 120 is, for the DSFF 10[i], equivalent to the data DA[i] from the data input circuit 4 and is, for the DSFF 30[i], equivalent to the data DB[i] output from the logic circuit 20 based on the pieces of data DA[1] to DA[MA] from the data input circuit 4. Due to the supply of the normal data D from the data input circuit 4 (DA[1] to DA[MA]) to the logic circuit 20 through the DSFFs 10[1] to 10[MA], the normal operation based on the normal data D from the data input circuit 4 (DA[1] to DA[MA]) is executed.

Next, the behavior of each circuit when only the test operation is continuously executed will be described. The section in which only the test operation is continuously executed is referred to as the test continuation section for convenience. In the test continuation section, the first clock section does not exist and the whole section becomes the second clock section (see FIG. 2A). That is, in the test continuation section, the clock signal CLK2 becomes completely the same signal as the reference clock signal CLK whereas the clock signal CLK1 is fixed at the low level. Therefore, in the test continuation section, the held data of the DFF 130 is sequentially updated in synchronization with the clock signal CLK2 and change does not occur in the held data by the DFF 120.

Furthermore, in the test continuation section, basically the values of the input selection signal SC and the output selection signal SEL are both fixed at "1." Here, the reason why the description of "basically" is made is because, even in the test continuation section, the value of the input selection signal SC to the DSFFs 30[1] to 30[MB] is set to "0" only at the time of execution of capture operation to be described later included in the test operation. When the values of the input selection signal SC and the output selection signal SEL are both fixed at "1," operation in which the scan data SD is taken in and held in the DFF 130 and the held data of the DFF 130 is output as the output data Q is repeatedly executed in synchronization with the clock signal CLK2.

Figure 5:
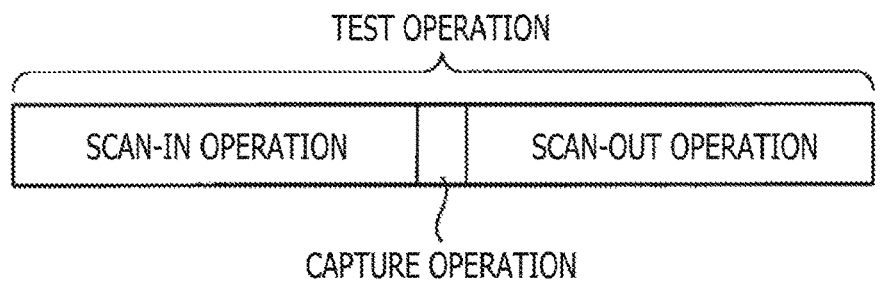
FIG. 5 is a diagram depicting a configuration of test operation according to the first embodiment of the present disclosure.

Details of the test operation will be described. As depicted in FIG. 5, the test operation is composed of scan-in operation, capture operation, and scan-out operation. The test operation of one round is completed through one time of scan-in operation, one time of capture operation, and one time of scan-out operation. In the test operation of one round, the scan-in operation, the capture operation, and the scan-out operation are executed in that order.

The scan-in operation is operation for causing the DSFFs 10[1] to 10[MA] to latch (hold) predetermined test pattern data and is referred to also as first shift operation. The test pattern data is data effective for diagnosis of whether or not a fault in the logic circuit 20 exists, and is generated in the test pattern generating circuit 3. The scan data SD to each DSFF is data based on the test pattern data. The data based on the test pattern data is held in the DFF 130 of each DSFF.

In the section in which the scan-in operation is executed, the signals SC and SEL of "1" are supplied to at least the DSFFs 10[1] to 10[MA] in the DSFFs 10[1] to 10[MA] and 30[1] to 30[MB]. Due to the supply of the signals SC and SEL of "1" to the DSFFs 10[1] to 10[MA], the DSFFs 10[1] to 10[MA] are serially connected and the first scan chain is formed. The first scan chain is equivalent to the first shift register composed of the MA DFFs 130 in total in the DSFFs 10[1] to 10[MA]. In the first shift register, the MA DFFs 130 in total in the DSFFs 10[1] to 10[MA] are serially connected through the respective input selection circuits 110 and the respective output selection circuits 140 and shift operation of data is executed in synchronization with the clock signal CLK2.

In the scan-in operation, the test pattern generating circuit 3 repeats operation of supplying data configuring the test pattern data to the DSFF 10[1] as the scan data SD one bit by one bit in synchronization with the reference clock signal CLK or the clock signal CLK2 and thereby causes the MA DFFs 130 in total in the DSFFs 10[1] to 10[MA] to hold (latch) the test pattern data of MA bits.

As above, when attention is paid to the DSFFs 10[1] to 10[MA], in each of the DSFFs 10[1] to 10[MA], the scan data SD is selected in the input selection circuit 110 based on the input selection signal SC and the held data of the DFF 130 that holds the data based on the test pattern data (scan data SD) is selected in the output selection circuit 140 based on the output selection signal SEL. Thereby, the first scan chain is formed.

In the capture operation, the test pattern data held (latched) by the MA DFFs 130 in total in the DSFFs 10[1] to 10[MA] is supplied to the logic circuit 20 as the pieces of output data QA[1] to QA[MA] and thereby the MB DFFs 130 in total in the DSFFs 30[1] to 30[MB] are caused to latch (i.e., take in and hold) the pieces of data DB[1] to DB[MB] output from the logic circuit 20.

In order to implement this, in the capture operation, the test pattern generating circuit 3 controls the level of the signal SC to the DSFFs 30[1] to 30[MB]. Specifically, at the timing when the pieces of data DB[1] to DB[MB] based on the test pattern data are output from the logic circuit 20, the test pattern generating circuit 3 sets the value of the signal SC to the DSFFs 30[1] to 30[MB] to "0" to thereby supply the pieces of data DB[1] to DB[MB] based on the test pattern data to the DFFs 130 in the DSFFs 30[1] to 30[MB]. Then, if an up-edge of the clock signal CLK2 occurs when the pieces of data DB[1] to DB[MB] based on the test pattern data are being supplied to the DFFs 130 in the DSFFs 30[1] to 30[MB], the pieces of data DB[1] to DB[MB] based on the test pattern data are taken in and held by the DFFs 130 in the DSFFs 30[1] to 30[MB].

The scan-out operation is operation for drawing out, to the test result evaluation circuit 8, the pieces of data DB[1] to DB[MB] based on the test pattern data held (latched) in the MB DFFs 130 in total in the DSFFs 30[1] to 30[MB] and is referred to also as second shift operation. In the section in which the scan-out operation is executed, the signals SC and SEL of "1" are supplied to at least the DSFFs 30[1] to 30[MB] in the DSFFs 10[1] to 10[MA] and 30[1] to 30[MB]. Due to the supply of the signals SC and SEL of "1" to the DSFFs 30[1] to 30[MB], the DSFFs 30[1] to 30[MB] are serially connected and the second scan chain is formed. The second scan chain is equivalent to the second shift register composed of the MB DFFs 130 in total in the DSFFs 30[1] to 30[MB]. In the second shift register, the MB DFFs 130 in total in the DSFFs 30[1] to 30[MB] are serially connected through the respective input selection circuits 110 and the respective output selection circuits 140 and shift operation of data is executed in synchronization with the clock signal CLK2.

In the scan-out operation, the pieces of data DB[1] to DB[MB] based on the test pattern data held in the DFFs 130 of the DSFFs 30[1] to 30[MB] are output from the DSFF 30[MB] to the test result evaluation circuit 8 as the scan output data SO one bit by one bit in synchronization with the clock signal CLK2.

As above, when attention is paid to the DSFFs 30[1] to 30[MB], in each of the DSFFs 30[1] to 30[MB], the scan data SD is selected in the input selection circuit 110 based on the input selection signal SC and the held data of the DFF 130 that holds the data based on the test pattern data is selected in the output selection circuit 140 based on the output selection signal SEL. Thereby, the second scan chain is formed. The pieces of data based on the test pattern data held in the DFFs 130 of the DSFFs 30[1] to 30[MB] are the pieces of data DB[1] to DB[MB] based on the test pattern data taken in by the capture operation and are equivalent to the scan data SD except for the capture operation.

Hereinafter, the pieces of data DB[1] to DB[MB] based on the test pattern data will be referred to as the test result data of MB bits. The test result evaluation circuit 8 determines whether or not a fault in the logic circuit 20 exists based on the supplied test result data. Specifically, the test result evaluation circuit 8 is composed of a response compression circuit 8*a* and a result comparison circuit 8*b* as depicted in FIG. 1. The response compression circuit 8*a* compresses the test result data of MB bits obtained by the scan-out operation by predetermined compression processing to convert it to the test result data of MB' bits. MB' has a predetermined value smaller than the value of MB. The result comparison circuit 8*b* compares the test result data of MB' bits obtained in the response compression circuit 8*a* with predetermined expected data to determine whether or not a fault in the logic circuit 20 exists.

Furthermore, in the section in which the scan-out operation is executed, the signals SC and SEL of "1" may be supplied also to the DSFFs 10[1] to 10[MA]. Due to this, the pieces of data latched by the DFFs 130 of the DSFFs 10[1] to 10[MA] in the execution section of the scan-in operation (ideally, corresponding with the test pattern data) are supplied from the DSFF 10[MA] to the test result evaluation circuit 8 as the scan output data SO in the execution section of the scan-out operation. The pieces of data supplied here (i.e., pieces of data latched by the DSFFs 10[1] to 10[MA] in the execution section of the scan-in operation) are also compressed in the response compression circuit 8*a*, and the result comparison circuit 8*b* can determine whether or not a fault in the DSFFs 10[1] to 10[MA] exists based on the data after this compression.

As depicted in FIG. 1, the test control signal to control and specify the execution timing of the scan test (in other words, test control signal to control and specify the execution timing of the test operation) is supplied from the test control circuit 6 to the test pattern generating circuit 3, the clock signal generating circuit 7, and the test result evaluation circuit 8, and synchronization of operation of each circuit is established based on the test control signal. That is, the test result evaluation circuit 8 recognizes the data that should be compressed by referring to the test control signal. Based on the test control signal, the test pattern generating circuit 3 supplies the test pattern data to the first scan chain and supplies the input selection signal SC and the output selection signal SEL to each DSFF (in other words, controls the signal level of the signals SC and SEL based on the test control signal). The clock signal generating circuit 7 generates the clock signals CLK1 and CLK2 from the reference clock signal CLK based on the test control signal.

Figure 13:
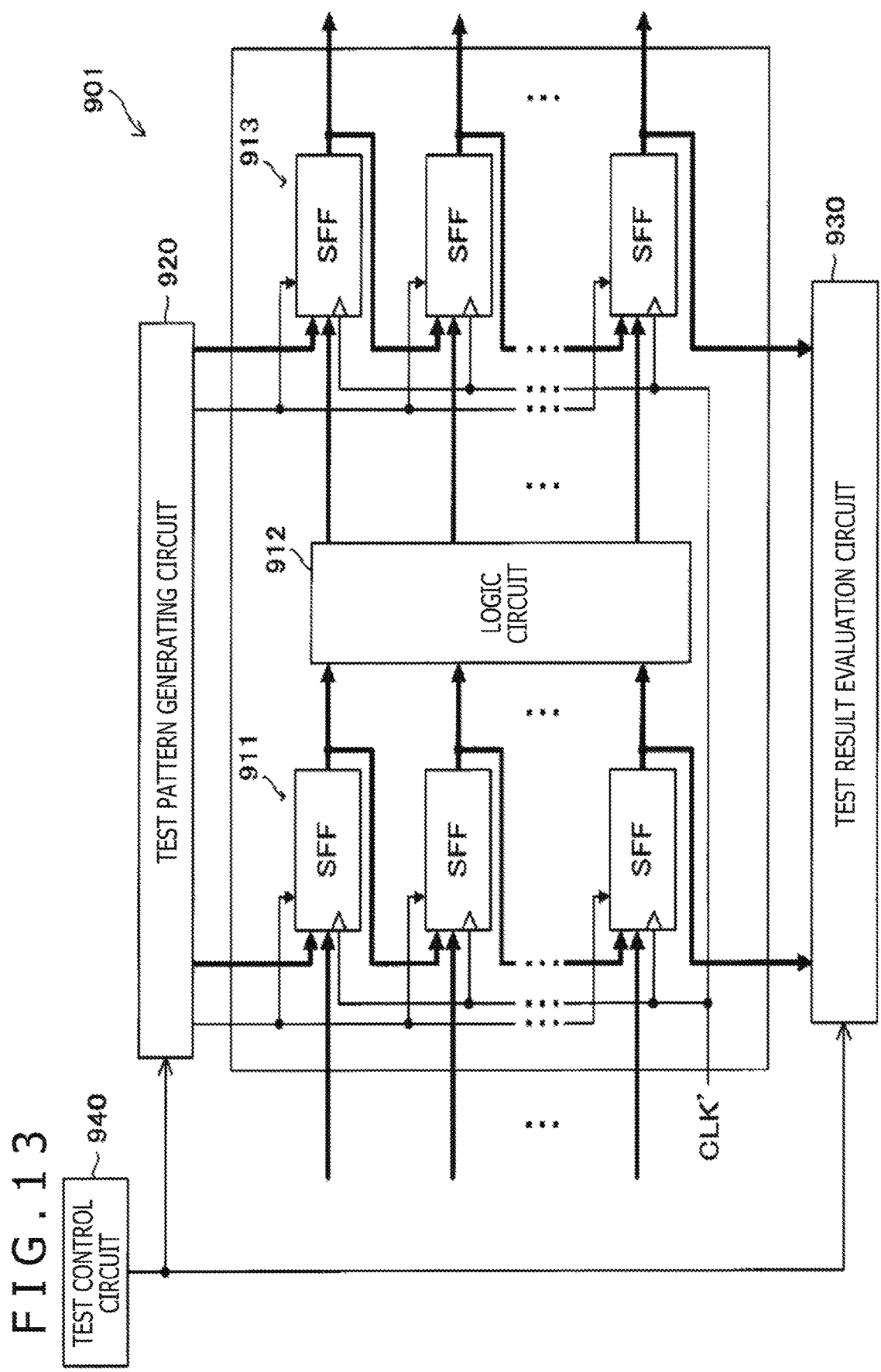
FIG. 13 is a configuration diagram of a data processing device configured to allow a scan test according to a related art.
Figure 14:
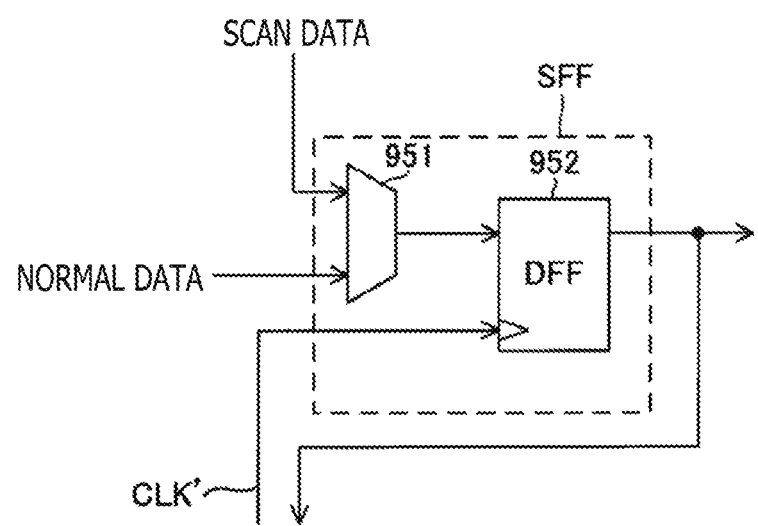
FIG. 14 is a configuration diagram of an existing scan flip-flop circuit.

Benefit of the configuration according to the present embodiment will be described in comparison with the related-art configuration of FIG. 13. As described with reference to FIG. 13, the related-art configuration involves the following circumstance (hereinafter, referred to as first circumstance). Specifically, once operation of a scan test is started, it is not until a series of operation due to the scan test is completed that the normal operation can be executed. Therefore, the scan test may not be applied to an application in which it is difficult to stop the normal operation for the time for fault diagnosis (for example, application of a communication control system). Furthermore, the related-art configuration involves also a circumstance in which the normal operation is reset every time operation of a scan test is executed (hereinafter, referred to as second circumstance). This means that the scan test can be executed only at the timing when the reset of the normal operation is permitted, and the configuration of FIG. 13 is unsuitable as a measure for periodically executing fault diagnosis.

In contrast, in the configuration of the present embodiment, the normal data D and the scan data SD are allowed to be held separately by the DSFFs and therefore concerns relating to these circumstances can also be eliminated.

Figure 6:
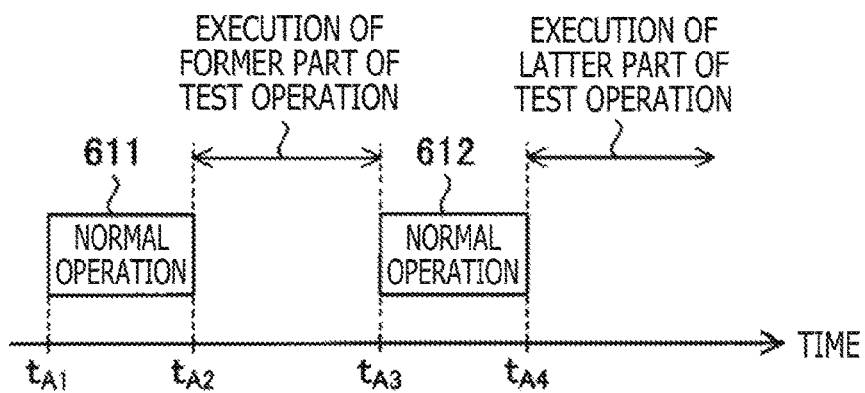
FIG. 6 is a diagram depicting a relationship example of execution timings of plural normal operations and test operation according to the first embodiment of the present disclosure.

As a simple example, a case will be considered in which, as depicted in FIG. 6, normal operation 611 is executed between timings tA1 and tA2 and execution of the normal operation is unnecessary between the timings tA2 and tA3 and normal operation 612 is executed between the subsequent timings tA3 and tA4. Suppose that the time length between the timings tA2 and tA3 is shorter than the time for completing the test operation of one round. Even in this case, in the data processing device 1, it is possible to execute only the former part of the test operation between the timings tA2 and tA3 and execute the latter part of the test operation after the timing tA4, for example.

Although the test operation is temporarily suspended at the timing tA3, the data state at the time of the suspension can be held in the DFF 130 of each DSFF and therefore the test operation can be resumed from the data state at the time of the suspension after the timing t4. Consequently, the concern relating to the above-described first circumstance is eliminated.

In addition, there are also many cases in which relevance exists between data in the normal operation 611 and data in the normal operation 612 and data of the timing immediately before the end of the normal operation 611 needs to continue to be held in the digital processing circuit 2 at the timing of start of the normal operation 612. For example, the case in which a series of normal operation is formed in the normal operations 611 and 612 but a time gap exists between the normal operations 611 and 612 corresponds to the above-described case. In the data processing device 1 according to the present embodiment, even when the test operation is executed between the timings tA2 and tA3, the normal operation 612 can be resumed on the basis of the data of the timing immediately before the end of the normal operation 611 because the data of the timing immediately before the end of the normal operation 611 continues to be held in the DFF 120 of each DSFF. That is, the normal operation is not reset every time the test operation is executed and the concern relating to the above-described second circumstance is also eliminated.

Figure 7:
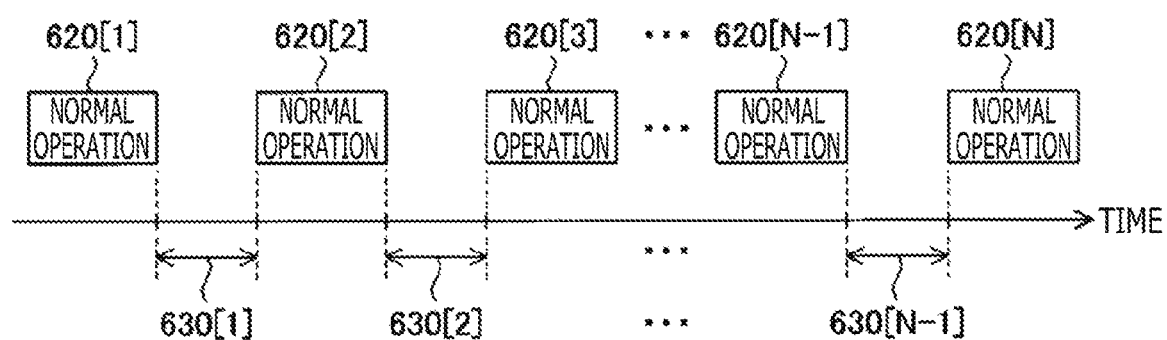
FIG. 7 is a diagram depicting an example of execution timings of plural normal operations according to the first embodiment of the present disclosure.

When the above-described concept is explained with generalization with reference to FIG. 7, the following description can be made. Suppose that normal operations 620[1], 620[2], 620[3], . . . , and 620[N] are executed in the digital processing circuit 2. N is a freely-selected integer equal to or larger than 3. Regarding a freely-selected integer i, the normal operation 620[i+1] is executed after the normal operation 620[i] and an interval 630[i] exists between the execution section of the normal operation 620[i] and the execution section of the normal operation 620[i+1]. Suppose that each of the intervals 630[1] to 630[N−1] is shorter than a predetermined test time TTEST that is the time for completing the test operation of one round and the total of the intervals 630[1] to 630[N−1] is equal to or longer than the test time TTEST. In this case, in the data processing device 1, in the process of execution of the normal operations 620[1] to 620[N], the test operation (operation in the scan test) is executed in a distributed manner (this is referred to as distributed execution of the test operation) by using the (N−1) intervals 630[1] to 630[N−1] in total existing between the execution section of the normal operation 620[1] and the execution section of the normal operation 620[N]. Specifically, the whole of the test operation of one round is divided into (N−1) operations and the divided operation is executed in each of the intervals 630[1] to 630[N−1] one by one. Thereby, the test operation of one round is completed over the whole of the intervals 630[1] to 630[N−1].

Each execution section of the normal operations 620[1] to 620[N] is set to the first clock section (see FIG. 2A) and the held data of the DFF 120 in each DSFF is updated in synchronization with the clock signal CLK1 in each execution section of the normal operations 620[1] to 620[N]. Each of the intervals 630[1] to 630[N−1] is set to the second clock section (see FIG. 2A) and the held data of the DFF 130 in each DSFF is updated in synchronization with the clock signal CLK2 in each of the intervals 630[1] to 630[N−1].

The test operation is executed by the test pattern generating circuit 3 and the digital processing circuit 2 under control by the test control circuit 6. It is also possible to interpret that processing of determination of whether or not a fault in the logic circuit 20 exists by the test result evaluation circuit 8 is also included in the test operation. In this case, in the execution main entity of the test operation, the test result evaluation circuit 8 is also further included in addition to the test pattern generating circuit 3 and the digital processing circuit 2.

Each of the intervals 630[1] to 630[N−1] is equivalent to a pause section of the normal operation. Hereinafter, the intervals 630[1] to 630[N−1] will be referred to as the pause sections 630[1] to 630[N−1], respectively, in some cases.

Information to identify the timings of execution sections and pause sections of the normal operation is referred to as timing information. By the timing information, the start and end timings of each execution section of the normal operations 620[1] to 620[N] are identified and the start timing and end timing of each of the pause sections 630[1] to 630[N−1] are identified. The timing information is generated and managed in a high-order system circuit that is included in the data processing device 1 and is not depicted in the diagram. The data input circuit 4 outputs and updates the pieces of data DA[1] to DA[MA] under control by the high-order system circuit. The test control circuit 6 implements distributed execution of the test operation by outputting the test control signal based on the timing information to the circuits 3, 7, and 8 under control by the high-order system circuit. The test control circuit 6 itself may be equivalent to the high-order system circuit.

For example, the normal operation may be interrupt processing of a central processing unit (CPU) disposed in the data processing device 1. This CPU includes the digital processing circuit 2 or is connected to the digital processing circuit 2, and executes the normal operation when receiving a predetermined interrupt request from a peripheral circuit (not depicted) disposed in the data processing device 1. After certain normal operation is completed, a pause section is made until an interrupt request occurs next. The test operation can be executed when such a pause section occurs. If the length of one pause section is equal to or longer than the test time TTEST, the test operation of one round is completed in this one pause section. However, when, after start of the test operation, the next normal operation is executed before completion of the test operation, the test operation is suspended and the test operation is resumed from the state at the time of the suspension after completion of this next normal operation.

After the first round of test operation is completed, if a pause section occurs, immediately the second round of test operation may be started. This allows continuation of diagnosis of whether or not a fault in the logic circuit 20 exists substantially in real time. Alternatively, after the first round of test operation is completed, the second round of test operation may be started on condition that a pause section occurs after the elapse of a predetermined time is waited.

Figure 8:
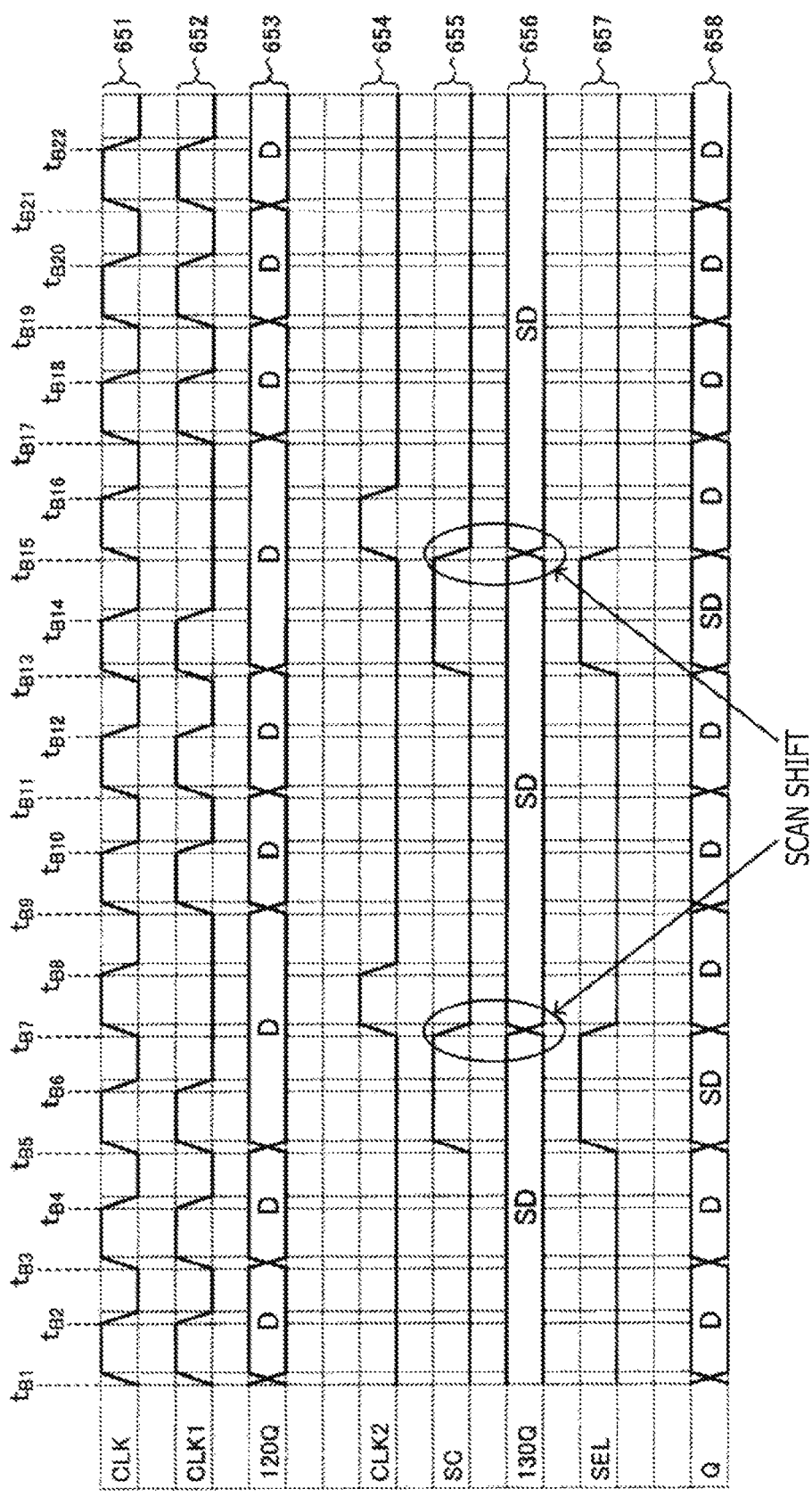
FIG. 8 is a timing chart of an operation example relating to the scan flip-flop circuit according to the first embodiment of the present disclosure.

FIG. 8 is a timing chart of an operation example relating to the DSFF 100. The operation example of FIG. 8 is an example of operation in which shift operation by the scan chain is inserted in between normal operations. In FIG. 8, in regions 651 to 658 that line up from the upper side toward the lower side, time-series change of the following elements is depicted: the reference clock signal CLK about the DSFF 100 relating to this operation example, the clock signal CLK1, the output data of the DFF 120 (i.e., data at the data output terminal 120Q), the clock signal CLK2, the input selection signal SC, the output data of the DFF 130 (i.e., data at the data output terminal 130Q), the output selection signal SEL, and the output data Q, respectively.

The timing chart of FIG. 8 will be described with focus on timings tB1 to tB22 for materialization of explanation. Regarding a freely-selected integer i, the length between the timings tBi and tB(i+2) corresponds with the length of one cycle of the reference clock signal CLK. Here, suppose that the duty of the reference clock signal CLK is 50%. Therefore, the length between the timings tBi and tB(i+1) corresponds with the length of half of one cycle of the reference clock signal CLK.

An up-edge of the reference clock signal CLK occurs at the timing tBi when the integer i is an odd number and a down-edge of the reference clock signal CLK occurs at the timing tBi when the integer i is an even number. In the section from the timing tB1 to the timing tB22, the section between the timings tB1 and tB6, the section between the timings tB9 and tB14, and the section between the timings tB17 and tB22 belong to the first clock section, and the other sections belong to the second clock section.

Therefore, an up-edge occurs in the clock signal CLK1 at each of the timings tB1, tB3, tB5, tB9, tB11, tB13, tB17, tB19, and tB21 and a down-edge occurs in the clock signal CLK1 at each of the timings tB2, tB4, tB6, tB10, tB12, tB14, tB18, tB20, and tB22. The clock signal CLK1 is set to the low level in the section after the down-edge at the timing tB6 and until the up-edge at the timing tB9 and the section after the down-edge at the timing tB14 and until the up-edge at the timing tB17.

Meanwhile, an up-edge occurs in the clock signal CLK2 at each of the timings tB7 and tB15 and a down-edge occurs in the clock signal CLK2 at each of the timings tB8 and tB16. The clock signal CLK2 is set to the low level in the section until the occurrence of the up-edge at the timing tB7, the section after the down-edge at the timing tB8 and until the occurrence of the up-edge at the timing tB15, and the section after the occurrence of the down-edge at the timing tB16.

An up-edge occurs in each of the input selection signal SC and the output selection signal SEL at each of the timings tB5 and tB13 and a down-edge occurs in each of the input selection signal SC and the output selection signal SEL at each of the timings tB7 and tB15. The input selection signal SC and the output selection signal SEL are set to the low level in the section until the occurrence of the up-edge at the timing tB5, the section after the down-edge at the timing tB7 and until the occurrence of the up-edge at the timing tB13, and the section after the occurrence of the down-edge at the timing tB15.

As depicted in the region 653, the output data of the DFF 120 (i.e., data at the data output terminal 120Q) is updated in synchronization with the up-edge of the clock signal CLK1. Strictly speaking, the output data of the input selection circuit 110 immediately before the timing when the up-edge occurs in the clock signal CLK1 is taken in and held (latched) by the DFF 120. For example, in response to the up-edge of the clock signal CLK1 at the timing tB3, the DFF 120 takes in and holds the normal data D selected in the input selection circuit 110 (output data of the input selection circuit 110 immediately before the timing tB3). In response to the up-edge of the clock signal CLK1 at the timing tB5, the DFF 120 takes in and holds the normal data D selected in the input selection circuit 110 (output data of the input selection circuit 110 immediately before the timing tB5). As above, the output data of the input selection circuit 110 immediately before the timing when the up-edge occurs in the clock signal CLK1 is the normal data D and thus the normal data D is held while being sequentially updated in synchronization with the clock signal CLK1 in the DFF 120.

As depicted in the region 656, the output data of the DFF 130 (i.e., data at the data output terminal 130Q) is updated in synchronization with the up-edge of the clock signal CLK2. Strictly speaking, the output data of the input selection circuit 110 immediately before the timing when the up-edge occurs in the clock signal CLK2 is taken in and held (latched) by the DFF 130. For example, in response to the up-edge of the clock signal CLK2 at the timing tB7, the DFF 130 takes in and holds the scan data SD selected in the input selection circuit 110 (output data of the input selection circuit 110 immediately before the timing tB7). As above, the output data of the input selection circuit 110 immediately before the timing when the up-edge occurs in the clock signal CLK2 is the scan data SD and thus the scan data SD is held while being sequentially updated in synchronization with the clock signal CLK2 in the DFF 130.

The DFFs 120 and 130 each output their own held data to the output selection circuit 140. Based on the output selection signal SEL according to the operation example of FIG. 8, in the section from the timing tB1 to the timing tB22, the output data Q corresponds with the output data of the DFF 130 (hence scan data SD) in the section between the timings tB5 and tB7 and the section between the timings tB13 and tB15 and the output data Q in the other sections corresponds with the output data of the DFF 120 (hence normal data D).

Shift operation by the scan chain (scan shift) is executed at each of points of two ellipses depicted in FIG. 8 (i.e., timings tB7 and tB15).

Second Embodiment

A second embodiment of the present disclosure will be described. The second embodiment and third and fourth embodiments to be described later are embodiments on the basis of the first embodiment. Regarding matters that are not particularly noted in the second to fourth embodiments, description of the first embodiment is applied also to the second to fourth embodiments as long as there is no contradiction. In interpretation of description of the second embodiment, priority may be given to the description of the second embodiment regarding a matter involving contradiction between the first and second embodiments (this applies also to the third and fourth embodiments to be described later). As long as there is no contradiction, any plural embodiments in the first to fourth embodiments may be combined.

Each of the DFFs 120 and 130 depicted in FIG. 4 may be configured as a master-slave flip-flop circuit. The master-slave flip-flop circuit includes a master latch circuit and a slave latch circuit disposed at the subsequent stage of the master latch circuit. The DFFs 120 and 130 may individually have the master latch circuit and the slave latch circuit. However, it is also possible to share the master latch circuit between the DFFs 120 and 130. This allows reduction in the circuit area. In the following, in the second embodiment, a method in which the master latch circuit is shared between the DFFs 120 and 130 will be described.

Figure 9:
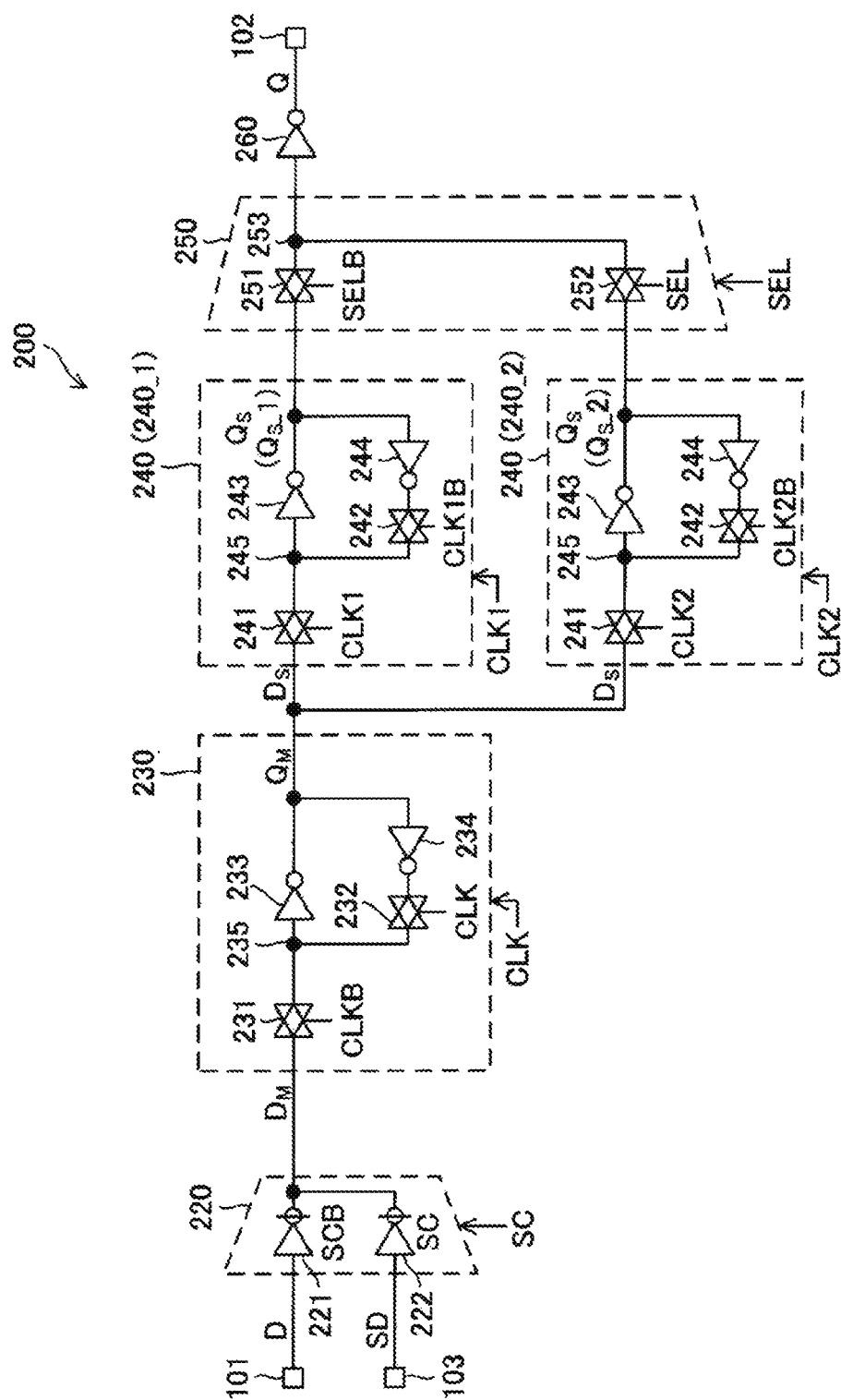
FIG. 9 is a configuration diagram of a scan flip-flop circuit according to a second embodiment of the present disclosure.

FIG. 9 is an internal configuration diagram of a DSFF 200 according to the second embodiment. The DSFF 200 can be used as the DSFF 100 depicted in FIG. 3 and FIG. 4. That is, the DSFF 200 can be used as each of the DSFFs 10[1] to 10[MA] and the DSFFs 30[1] to 30[MB] in FIG. 1.

The DSFF 200 includes an input selection circuit 220, a master latch circuit 230, two slave latch circuits 240, an output selection circuit 250, and an inverter circuit 260. The DSFF 200 is configured as what is generally called a master-slave flip-flop circuit. On the subsequent stage side of the master latch circuit 230, the two slave latch circuits 240 are disposed in parallel with respect to the master latch circuit 230. When the two slave latch circuits 240 need to be discriminated from each other, one in the two slave latch circuits 240 is referenced by numeral "240_1" and the other is referenced by numeral "240_2." The input selection circuit 220 and the output selection circuit 250 are equivalent to the input selection circuit 110 and the output selection circuit 140, respectively, in FIG. 4. The combination of the master latch circuit 230 and the slave latch circuit 240_1 is equivalent to the DFF 120 in FIG. 4 and the combination of the master latch circuit 230 and the slave latch circuit 240_2 is equivalent to the DFF 130 in FIG. 4.

The input selection circuit 220 is connected to the normal data input part 101 and the scan data input part 103 and connects either one of the input parts 101 and 103 to the input terminal of the master latch circuit 230 based on the input selection signal SC. Specifically, the input selection circuit 220 includes tri-state buffers 221 and 222 of an inverter type. The state of the tri-state buffer 221 is controlled based on an inversion signal SCB of the input selection signal SC and the state of the tri-state buffer 222 is controlled based on the input selection signal SC. Furthermore, when the input selection signal SC is at the high level, the input selection circuit 220 supplies the inversion signal of a signal indicating the scan data SD applied to the input part 103 to the master latch circuit 230 through the tri-state buffer 222 as a signal indicating master input data DM. On the other hand, when the input selection signal SC is at the low level, the input selection circuit 220 supplies the inversion signal of a signal indicating the normal data D applied to the input part 101 to the master latch circuit 230 through the tri-state buffer 221 as the signal indicating the master input data DM.

The signal indicating the master input data DM is supplied to the input terminal of the master latch circuit 230 and a signal indicating master output data QM according to the master input data DM is output from the output terminal of the master latch circuit 230. The signal indicating the master output data QM is supplied to the input terminal of each slave latch circuit 240 as a signal indicating slave input data DS. Each slave latch circuit 240 generates slave output data QS according to the slave input data DS and outputs a signal indicating the slave output data QS from its own output terminal. The output selection circuit 250 selects either one of two pieces of slave output data QS from the two slave latch circuits 240 based on the output selection signal SEL and outputs a signal indicating the selected slave output data QS. The inverter circuit 260 generates the inversion signal of the signal indicating the slave output data QS selected and output in the output selection circuit 250 as a signal indicating the output data Q. The signal indicating the output data Q is output from the data output part 102.

The signal indicating the normal data D, the signal indicating the scan data SD, the signal indicating the master input data DM, the signal indicating the master output data QM, the signal indicating the slave input data DS, the signal indicating the slave output data QS, and the signal indicating the output data Q are each a 1-bit digital signal that takes a signal level of the low level or high level.

Here, suppose that the normal data D, the scan data SD, the master output data QM, the slave input data DS, and the output data Q are defined based on the positive logic and the master input data DM and the slave output data QS are defined based on the negative logic. That is, suppose that, when the signal level of a signal indicating attention-paid data that is the data D, SD, QM, DS, or Q is the high level or low level, this attention-paid data has a logical value of "1" or "0," respectively. Conversely, suppose that, when the signal level of a signal indicating attention-paid data that is the data DM or QS is the high level or low level, this attention-paid data has a logical value of "0" or "1," respectively.

Regarding a freely-selected latch circuit or selection circuit, input of a signal indicating certain data to this circuit is synonymous with input of the certain data to this circuit and output of a signal indicating certain data from this circuit is synonymous with output of the certain data from this circuit. Therefore, in the following, for example, that the signal indicating the master input data DM is input to the master latch circuit 230 is often expressed as input of the master input data DM to the master latch circuit 230, and that the signal indicating the master output data QM is output from the master latch circuit 230 is often expressed as output of the master output data QM from the master latch circuit 230.

The reference clock signal CLK is supplied to the master latch circuit 230 and the clock signals CLK1 and CLK2 are supplied to the slave latch circuits 240_1 and 240_2, respectively. Thus, in the second embodiment, the reference clock signal CLK is also supplied to the digital processing circuit 2 in addition to the clock signals CLK1 and CLK2. Alternatively, with supply of the reference clock signal CLK to the digital processing circuit 2, the clock selective output circuit 7b may be included in the digital processing circuit 2. At this time, the clock selective output circuit 7b may be disposed in each DSFF.

The master latch circuit 230 takes in and holds (latches) the data DM in response to level change of the reference clock signal CLK. The slave latch circuit 240_1 takes in and holds (latches) the data DS in response to level change of the clock signal CLK1. The slave latch circuit 240_2 takes in and holds (latches) the data DS in response to level change of the clock signal CLK2. The configuration and operation of the master latch circuit 230, the slave latch circuits 240, and the output selection circuit 250 will be described in detail.

The master latch circuit 230 includes switches 231 and 232 and inverter circuits 233 and 234. A freely-selected switch including the switches 231 and 232 is an analog switch as a bidirectional switch and may be a transmission gate configured by using a complementary metal-oxide-semiconductor (CMOS) field effect transistor, for example. The freely-selected switch including the switches 231 and 232 has a first terminal, a second terminal, and a control terminal and the first terminal and the second terminal become a conductive state or a non-conductive state (blocking state) according to the level of a signal supplied to the control terminal. That the first terminal and the second terminal become the conductive state is referred to as the on-state, and the first terminal and the second terminal become the non-conductive state (blocking state) is referred to as the off-state. Here, suppose that, regarding the freely-selected switch including the switches 231 and 232, this switch becomes the on-state when the level of the signal to the control terminal is the high level and this switch becomes the off-state when the level of the signal to the control terminal is the low level.

The signal indicating the master input data DM is input from the input selection circuit 220 to the first terminal of the switch 231 and the second terminal of the switch 231 is connected to a node 235. The input terminal of the inverter circuit 233 is connected to the node 235. The inverter circuit 233 outputs the inversion signal of a signal applied to its own input terminal from its own output terminal. The output signal of the inverter circuit 233 becomes the signal indicating the master output data QM. The output terminal of the inverter circuit 233 is connected to the input terminal of the inverter circuit 234. The inverter circuit 234 outputs the inversion signal of a signal applied to its own input terminal from its own output terminal. Therefore, the inversion signal of the signal indicating the master output data QM is output from the output terminal of the inverter circuit 234. The first terminal of the switch 232 is connected to the output terminal of the inverter circuit 234 and the second terminal of the switch 232 is connected to the node 235.

Figure 10A:
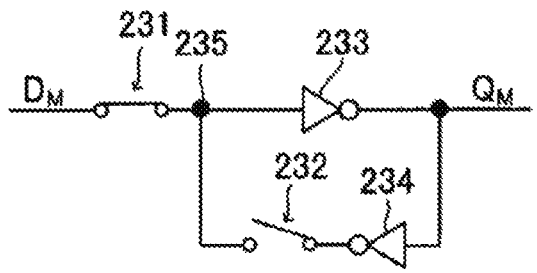
FIGS. 10A and 10B are conceptual diagrams of a through-state and a hold-state in a master latch circuit in FIG. 9.
Figure 10B:
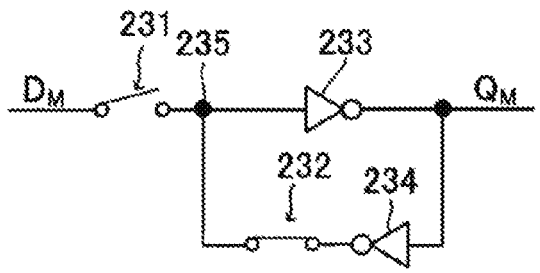

The reference clock signal CLK is input to the control terminal of the switch 232 and an inversion signal CLKB of the reference clock signal CLK is input to the control terminal of the switch 231. Thus, when the reference clock signal CLK is at the low level, the switch 231 becomes the on-state and the switch 232 becomes the off-state and thereby the master latch circuit 230 becomes the through-state (master through-state). When the reference clock signal CLK is at the high level, the switch 231 becomes the off-state and the switch 232 becomes the on-state and thereby the master latch circuit 230 becomes the hold-state (master hold-state). In FIGS. 10A and 10B, the through-state and the hold-state of the master latch circuit 230 are schematically depicted.

It can be thought that the master latch circuit 230 includes a master output circuit that can output the master output data QM according to the master input data DM and a master feedback circuit that can feed back the master output data QM to the input side of the master output circuit. In the master latch circuit 230 in FIG. 9, the master output circuit is configured by the inverter circuit 233 or by the switch 231 and the inverter circuit 233 and the master feedback circuit is configured by the inverter circuit 234 or by the switch 232 and the inverter circuit 234. The feedback by the master feedback circuit means supply of the output signal of the inverter circuit 234 based on the master output data QM to the node 235.

In the master latch circuit 230, in the through-state (master through-state), the present master output data QM is generated based on the present master input data DM without execution of the feedback by the master feedback circuit. In the master latch circuit 230, in the hold-state (master hold-state), the present master output data QM is generated based on the fed-back data by the master feedback circuit (output data of the inverter circuit 234) irrespective of the present master input data DM.

The slave latch circuits 240_1 and 240_2 have configurations identical to each other and each slave latch circuit 240 includes switches 241 and 242 and inverter circuits 243 and 244. In each of the slave latch circuits 240_1 and 240_2, the signal indicating the master output data QM from the master latch circuit 230 is input to the first terminal of the switch 241 as the signal indicating the slave input data DS.

In each slave latch circuit 240, the second terminal of the switch 241 is connected to a node 245 and the input terminal of the inverter circuit 243 is connected to the node 245. The inverter circuit 243 outputs the inversion signal of a signal applied to its own input terminal from its own output terminal. The output signal of the inverter circuit 243 becomes the signal indicating the slave output data QS. In each slave latch circuit 240, the output terminal of the inverter circuit 243 is connected to the input terminal of the inverter circuit 244. The inverter circuit 244 outputs the inversion signal of a signal applied to its own input terminal from its own output terminal. Therefore, in each slave latch circuit 240, the inversion signal of the signal indicating the slave output data QS is output from the output terminal of the inverter circuit 244. In each slave latch circuit 240, the first terminal of the switch 242 is connected to the output terminal of the inverter circuit 244 and the second terminal of the switch 242 is connected to the node 245.

In each slave latch circuit 240, a clock signal is input to the control terminal of the switch 241 and the inversion signal of the clock signal is input to the control terminal of the switch 242. Here, the clock signal in the slave latch circuit 240_1 is the clock signal CLK1 and the clock signal in the slave latch circuit 240_2 is the clock signal CLK2. Therefore, in the slave latch circuit 240_1, the clock signal CLK1 is input to the control terminal of the switch 241 whereas an inversion signal CLK1B of the clock signal CLK1 is input to the control terminal of the switch 242. In the slave latch circuit 240_2, the clock signal CLK2 is input to the control terminal of the switch 241 whereas an inversion signal CLK2B of the clock signal CLK2 is input to the control terminal of the switch 242.

Thus, when the clock signal CLK1 is at the high level, the switch 241 becomes the on-state and the switch 242 becomes the off-state in the slave latch circuit 240_1 and thereby the slave latch circuit 240_1 becomes the through-state (slave through-state). When the clock signal CLK1 is at the low level, the switch 241 becomes the off-state and the switch 242 becomes the on-state in the slave latch circuit 240_1 and thereby the slave latch circuit 240_1 becomes the hold-state (slave hold-state).

Similarly to this, when the clock signal CLK2 is at the high level, the switch 241 becomes the on-state and the switch 242 becomes the off-state in the slave latch circuit 240_2 and thereby the slave latch circuit 240_2 becomes the through-state (slave through-state). When the clock signal CLK2 is at the low level, the switch 241 becomes the off-state and the switch 242 becomes the on-state in the slave latch circuit 240_2 and thereby the slave latch circuit 240_2 becomes the hold-state (slave hold-state).

Figure 11A:
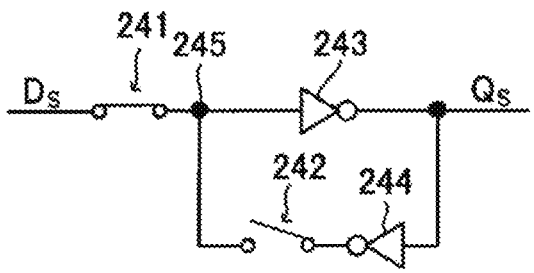
FIGS. 11A and 11B are conceptual diagrams of a through-state and a hold-state in a slave latch circuit in FIG. 9.
Figure 11B:
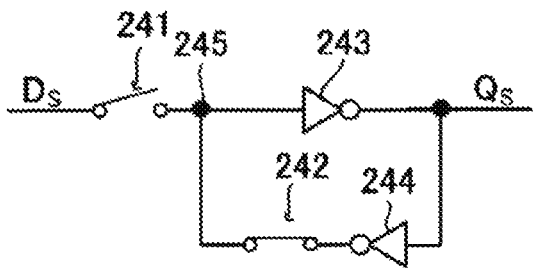

In FIGS. 11A and 11B, the through-state and the hold-state of one slave latch circuit 240 are schematically depicted.

It can be thought that each of the slave latch circuits 240_1 and 240_2 includes a slave output circuit that can output the slave output data QS according to the slave input data DS and a slave feedback circuit that can feed back the slave output data QS to the input side of the slave output circuit. In each slave latch circuit 240 in FIG. 9, the slave output circuit is configured by the inverter circuit 243 or by the switch 241 and the inverter circuit 243 and the slave feedback circuit is configured by the inverter circuit 244 or by the switch 242 and the inverter circuit 244. The feedback by the slave feedback circuit means supply of the output signal of the inverter circuit 244 based on the slave output data QS to the node 245.

In each slave latch circuit 240, in the through-state (slave through-state), the present slave output data QS is generated based on the present slave input data DS without execution of the feedback by the slave feedback circuit. In each slave latch circuit 240, in the hold-state (slave hold-state), the present slave output data QS is generated based on the fed-back data by the slave feedback circuit (output data of the inverter circuit 244) irrespective of the present slave input data DS.

Hereinafter, according to need, the pieces of slave output data QS generated and output by the slave latch circuits 240_1 and 240_2 are referenced by symbols "QS_1" and "QS_2," respectively.

The output selection circuit 250 includes switches 251 and 252. The first terminal of the switch 251 is connected to the output terminal of the slave latch circuit 240_1 whereas the first terminal of the switch 252 is connected to the output terminal of the slave latch circuit 240_2. Therefore, the signal indicating the slave output data QS_1 from the slave latch circuit 240_1 is input to the first terminal of the switch 251 and the signal indicating the slave output data QS_2 from the slave latch circuit 240_2 is input to the first terminal of the switch 252. The respective second terminals of the switches 251 and 252 are connected in common at a node 253 equivalent to the output terminal of the output selection circuit 250. The output terminal of the output selection circuit 250 (i.e., node 253) is connected to the input terminal of the inverter circuit 260.

The output selection circuit 250 selects either one of the pieces of slave output data QS_1 and QS_2 based on the output selection signal SEL. The selected data is output from the data output part 102 through the inverter circuit 260 as the output data Q.

The output selection signal SEL is input to the control terminal of the switch 252 and an inversion signal SELB of the output selection signal SEL is input to the control terminal of the switch 251. Thus, when the output selection signal SEL is at the low level, the switch 251 becomes the on-state and the switch 252 becomes the off-state and the slave output data QS_1 is selected in the output selection circuit 250. As a result, the inversion signal of the signal indicating the slave output data QS_1 is output from the output terminal of the inverter circuit 260 (that is, the slave output data QS_1 becomes the output data Q). On the other hand, when the output selection signal SEL is at the high level, the switch 251 becomes the off-state and the switch 252 becomes the on-state and the slave output data QS_2 is selected in the output selection circuit 250. As a result, the inversion signal of the signal indicating the slave output data QS_2 is output from the output terminal of the inverter circuit 260 (that is, the slave output data QS_2 becomes the output data Q).

In the DSFF 200 configured as described above, in the master latch circuit 230, either of the normal data D and the scan data SD is input and held based on the input selection signal SC. However, the data taken in and held (latched) by the slave latch circuit 240_1 is limited to the normal data D in the normal operation based on the clock signal CLK1 and the data taken in and held (latched) by the slave latch circuit 240_2 is limited to the data based on the test pattern data (scan data SD except for in the capture operation) based on the clock signal CLK2.

Third Embodiment

The third embodiment of the present disclosure will be described. Each DSFF according to the first and second embodiments includes a first holding circuit and a second holding circuit. In the configuration according to the first embodiment (see FIG. 4), the first holding circuit corresponds to the DFF 120 and the second holding circuit corresponds to the DFF 130. In the configuration according to the second embodiment (see FIG. 9), the first holding circuit corresponds to the combination of the master latch circuit 230 and the slave latch circuit 240_1 and the second holding circuit corresponds to the combination of the master latch circuit 230 and the slave latch circuit 240_2.

In the first and second embodiments, the first holding circuit (for example, DFF 120) of each DSFF has a first function of taking in and holding the normal data D from the input selection circuit (for example, 110) in the normal operation and the second holding circuit (for example, DFF 130) of each DSFF has a second function of taking in and holding the scan data SD from the input selection circuit (for example, 110) when the scan chain is formed. The first holding circuit takes in and holds the normal data D based on the clock signal CLK1 and the second holding circuit takes in and holds the scan data SD based on the clock signal CLK2.

The scan test is mainly for executing fault diagnosis of the logic circuit 20. However, regular operation of the digital processing circuit 2 is not guaranteed also when a fault occurs in the DSFF 10 or 30. For this reason, it is preferable that whether or not a fault in the DSFF 10 or 30 exists be also diagnosed in the scan test. However, if the function assigned to the first holding circuit is fixed to the first function and the function assigned to the second holding circuit is fixed to the second function as described above, the data supplied to the test result evaluation circuit 8 is data that does not depend on operation of the first holding circuit and therefore it is difficult to diagnose whether or not a fault in the first holding circuit exists in the scan test.

Figure 12:
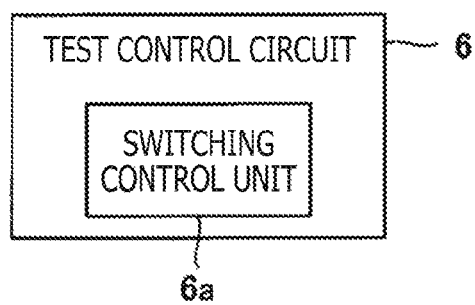
FIG. 12 is a configuration diagram of a test control circuit according to a third embodiment of the present disclosure.

In order to eliminate this, as depicted in FIG. 12, a switching control unit 6a for switching the functions assigned to the first and second holding circuits may be disposed in the data processing device 1. Here, suppose that the switching control unit 6a is included in the constituent elements of the test control circuit 6. However, the switching control unit 6a may be disposed separately from the test control circuit 6.

As the state of assignment of functions to the first and second holding circuits, there are a first assignment state in which the first and second functions are assigned to the first and second holding circuits, respectively, and a second assignment state in which the second and first functions are assigned to the first and second holding circuits, respectively.

Operation of each DSFF in the first assignment state is as depicted in the first or second embodiment. Specifically, in the first assignment state, the first holding circuit (for example, DFF 120) of each DSFF takes in and holds the normal data D from the input selection circuit (for example, 110) in the normal operation based on the first clock signal (CLK1) and the second holding circuit (for example, DFF 130) of each DSFF takes in and holds the scan data SD from the input selection circuit (for example, 110) based on the second clock signal (CLK2) when the scan chain is formed.

In contrast, in the second assignment state, the functions assigned to the first and second holding circuits are reversed on the basis of the first assignment state. In order to implement this, in the second assignment state, the relationship between the reference clock signal CLK and the clock signals CLK1 and CLK2 is reversed on the basis of the first assignment state.

That is, in the second assignment state, the test control signal including the clock selection signal SELC (see FIG. 2B) is supplied from the switching control unit 6a (test control circuit 6) to the clock selective output circuit 7b in the following manner. In the section in which the normal operation is executed, the clock signal CLK2 has the same signal level as the reference clock signal CLK and the clock signal CLK1 is fixed at the low level. In addition, in the section in which the test operation is executed, the clock signal CLK1 has the same signal level as the reference clock signal CLK and the clock signal CLK2 is fixed at the low level.

Moreover, in the second assignment state, the signal level of the output selection signal SEL is inversed between the low level and the high level on the basis of the first assignment state. The test control signal including a signal to direct implementation of this can be supplied from the switching control unit 6a (test control circuit 6) to the test pattern generating circuit 3. Due to the inversion of the signal level of the output selection signal SEL on the basis of the first assignment state, the output selection signal SEL is set to the high level (value is "1") in the section in which the normal data D in the normal operation should become the output data Q and the output selection signal SEL is set to the low level (value is "0") in the section in which the scan chain is formed and the scan data SD should become the output data Q.

As a result, in the second assignment state, the clock signal CLK1 corresponds with the reference clock signal CLK when the scan chain is formed. Thus, the first holding circuit (for example, DFF 120) of each DSFF takes in and holds the scan data SD from the input selection circuit (for example, 110) when the scan chain is formed based on the first clock signal (CLK1). At this time, the output selection signal SEL is set to the low level (value is "0") and therefore shift operation by the scan chain is implemented. In the second assignment state, the first scan chain is formed in the MA DFFs 120 in total in the DSFFs 10[1] to 10[MA] and the second scan chain is formed in the MB DFFs 120 in total in the DSFFs 30[1] to 30[MB].

Furthermore, in the second assignment state, the clock signal CLK2 corresponds with the reference clock signal CLK in the section in which the normal operation is executed. Therefore, the second holding circuit (for example, DFF 130) of each DSFF takes in and holds the normal data D from the input selection circuit (for example, 110) in the normal operation based on the second clock signal (CLK2). At this time, the output selection signal SEL is set to the high level (value is "1") and thus the normal data D becomes the output data Q.

The switching control unit 6a can switch the state of assignment of functions to the first and second holding circuits from the first assignment state to the second assignment state or from the second assignment state to the first assignment state at a predetermined timing. For example, the switching of the first assignment state and the second assignment state may be executed every time the test operation of one round is completed or every time the test operation of a predetermined number of rounds equal to or larger than 2 is completed. Executing such switching allows execution of diagnosis of a fault including a fault in the DSFF.

Fourth Embodiment

The fourth embodiment of the present disclosure will be described. In the fourth embodiment, supplementary matters, applied techniques, modified techniques, and so forth with respect to the first to third embodiments will be described.

The operation example of FIG. 8 is merely one operation example that can be applied to the present disclosure. A method can also be employed in which the normal operation and the test operation are alternately switched and executed every one cycle of the reference clock signal CLK. For example, if a digital processing circuit that should execute signal processing by the normal operation at a speed comparable to 200 kHz originally exists, when the above-described method is employed with the reference clock signal CLK set to 400 kHz, the normal operation at a speed comparable to 200 kHz and the test operation at a speed comparable to 200 kHz are executed in parallel in the digital processing circuit 2.

Although the specific description is made with the assumption that the DFFs 120 and 130 are positive-edge-triggered DFFs, the DFFs 120 and 130 may be configured as negative-edge-triggered DFFs.

A modification is also possible in which the data output part 102 of the DSFF 10[MA] is connected to the scan data input part 103 of the DSFF 30[1]. In this case, the test operation can be executed through configuring a single scan chain (single shift register) composed of the DSFFs 10[1] to 10[MA] and 30[1] to 30[MB].

For simplification of description, attention is paid to one logic circuit 20 in the digital processing circuit 2. However, plural logic circuits including a combinational circuit may be disposed in the digital processing circuit 2 and plural scan flip-flop circuits that can form a scan chain may be disposed at each of the previous stage and the subsequent stage of each logic circuit. Each scan flip-flop circuit can be configured as a DSFF. When first and second logic circuits are included in the plural logic circuits and the first logic circuit is equivalent to the logic circuit 20, the second logic circuit executes signal processing based on the pieces of output data QB[1] to QB[MB] of the DSFFs 30[1] to 30[MB] and plural DSFFs for receiving and holding output data of the second logic circuit are disposed at the subsequent stage of the second logic circuit.

The data processing device 1 may be formed in the form of a semiconductor integrated circuit and a semiconductor device may be configured by enclosing this semiconductor integrated circuit in a chassis (package) formed of a resin. For example, the semiconductor device may be a CPU or may be a power supply IC for configuring a power supply circuit, a motor driver IC for driving a motor, or an LED driver IC for driving a light emitting diode (LED).

The semiconductor integrated circuit (in other words, semiconductor device) including the data processing device 1 can be mounted on any equipment and is used for any use-purpose. For example, this semiconductor integrated circuit can be mounted on a vehicle such as a car. In in-vehicle use, real-time property of fault diagnosis is desired in many cases. In this point, configurations according to the present disclosure are beneficial.

Embodiments of the present disclosure can be variously changed as appropriate within the range of technical ideas depicted in the scope of claims. The above embodiments are absolute examples of embodiments of the present disclosure and the meanings of terms of the present disclosure or the respective constituent requirements are not limited to those described in the above embodiments. Specific numerical values depicted in the above explanatory description are mere exemplification and they can be changed to various numerical values, of course.

The present disclosure contains subject matter related to that disclosed in Japanese Priority Patent Application JP 2019-065962 filed in the Japan Patent Office on Mar. 29, 2019, the entire content of which is hereby incorporated by reference.

What is claimed is:

1. A semiconductor integrated circuit comprising:
a logic circuit; and
a plurality of scan flip-flop circuits configured to:
hold input data or output data of the logic circuit; and
form a scan chain for execution of a scan test of the logic circuit, wherein each scan flip-flop circuit of the plurality of scan flip-flop circuits includes:
a scan data input part configured to receive an input of scan data for the scan test;
a normal data input part configured to receive an input of normal data different from the scan data;
a first holding circuit configured to hold one of the normal data in a normal operation or the scan data; and
a second holding circuit configured to hold other of the one of the normal data or the scan data.

2. The semiconductor integrated circuit according to claim 1, further comprising:
a test pattern generating circuit configured to:
generate test pattern data supplied to the scan chain in the scan test; and
supply an input selection signal and an output selection signal to each scan flip-flop circuit of the plurality of scan flip-flop circuits, wherein each scan flip-flop circuit of the plurality of scan flip-flop circuits includes:
an input selection circuit configured to each of select and output one of the normal data or the scan data based on the input selection signal, wherein
the first holding circuit is further configured to each of receive and hold the one of the normal data or the scan data from the input selection circuit based on a first clock signal, and
the second holding circuit is further configured to each of receive and hold the other of the one of the normal data or the scan data from the input selection circuit based on a second clock signal; and
an output selection circuit configured to select and output one of the normal data or the scan data, held in one of the first holding circuit or the second holding circuit, based on the output selection signal.

3. The semiconductor integrated circuit according to claim 2, wherein in each scan flip-flop circuit of the plurality of scan flip-flop circuits, the scan chain is formed based on:
selection of the scan data in the input selection circuit based on the input selection signal, and
selection of the scan data, held in one of the first holding circuit or the second holding circuit, in the output selection circuit based on the output selection signal.

4. The semiconductor integrated circuit according to claim 2, wherein
the plurality of scan flip-flop circuits is composed of a first scan flip-flop group configured to hold the input data to the logic circuit and a second scan flip-flop group configured to hold the output data from the logic circuit,
the semiconductor integrated circuit further comprises a data input circuit configured to supply the normal data to each scan flip-flop circuit of the first scan flip-flop group, and
the normal operation based on the normal data from the data input circuit is executed by supply of the normal data from the data input circuit to the logic circuit through the first scan flip-flop group.

5. The semiconductor integrated circuit according to claim 4, wherein in a process of sequential execution of N times of the normal operation at intervals, test operation in the scan test is executed in a distributed manner by using (N−1) intervals that exist between an execution section of a first round of the normal operation and an execution section of an N-th round of the normal operation (N is an integer equal to or larger than 3).

6. The semiconductor integrated circuit according to claim 4, wherein in each scan flip-flop circuit of the plurality of scan flip-flop circuits:
the first holding circuit is further configured to receive and hold the normal data from the input selection circuit in the normal operation based on the first clock signal, and
the second holding circuit is further configured to take in and hold the scan data from the input selection circuit based on the second clock signal when the scan chain is formed.

7. The semiconductor integrated circuit according to claim 4, further comprising:
a switching control unit configured to execute switching between a first state and a second state, wherein
in the first state, in each scan flip-flop circuit of the plurality of scan flip-flop circuits:
the first holding circuit is further configured to each of receive and hold the normal data from the input selection circuit in the normal operation based on the first clock signal, and
the second holding circuit is further configured to each of receive and hold the scan data from the input selection circuit based on the second clock signal when the scan chain is formed, and in the second state, in each scan flip-flop circuit of the plurality of scan flip-flop circuits:
the first holding circuit is further configured to each of receive and hold the scan data from the input selection circuit based on the first clock signal when the scan chain is formed, and
the second holding circuit is further configured to each of receive and hold the normal data from the input selection circuit in the normal operation based on the second clock signal.

8. The semiconductor integrated circuit according to claim 2, further comprising:
a clock signal generating circuit configured to:
generate each of the first clock signal and the second clock signal based on a reference clock signal whose signal level cyclically changes between a first level and a second level, and
set a first section in which a signal level of the first clock signal changes between the first level and the second level and a second section in which a signal level of the second clock signal changes between the first level and the second level in such a manner that the first section and the second section are separated from each other.

9. The semiconductor integrated circuit according to claim 8, wherein in each scan flip-flop circuit of the plurality of scan flip-flop circuits:
the first holding circuit is further configured to receive and hold the one of the normal data or the scan data from the input selection circuit according to a predetermined level change of the first clock signal in the first section, and
the second holding circuit is further configured to receive and hold the other of one of the normal data or the scan data from the input selection circuit according to a predetermined level change of the second clock signal in the second section.

10. The semiconductor integrated circuit according to claim 8, further comprising:
a test control circuit configured to generate a test control signal for controlling execution timing of the scan test, wherein
the test pattern generating circuit is further configured to:
supply the test pattern data to the scan chain based on the test control signal; and
supply the input selection signal and the output selection signal to each scan flip-flop circuit of the plurality of scan flip-flop circuits based on the test control signal, and
the clock signal generating circuit is further configured to generate the first clock signal and the second clock signal from the reference clock signal based on the test control signal.

\* \* \* \* \*